US009263690B2

(12) United States Patent
Kuribe et al.

(10) Patent No.: US 9,263,690 B2
(45) Date of Patent: Feb. 16, 2016

(54) ORGANIC EL DEVICE AND MANUFACTURING METHOD THEREOF

(71) Applicant: KANEKA CORPORATION, Osaka-shi, Osaka (JP)

(72) Inventors: Eiji Kuribe, Toyooka (JP); Jumpei Suzuki, Toyooka (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 14/370,754

(22) PCT Filed: Dec. 20, 2012

(86) PCT No.: PCT/JP2012/083061
§ 371 (c)(1),
(2) Date: Jul. 3, 2014

(87) PCT Pub. No.: WO2013/103093
PCT Pub. Date: Jul. 11, 2013

(65) Prior Publication Data
US 2014/0361280 A1 Dec. 11, 2014

(30) Foreign Application Priority Data

Jan. 5, 2012 (JP) ................................. 2012-000689

(51) Int. Cl.
*H01L 51/50* (2006.01)
*H01L 27/32* (2006.01)
*H05B 33/00* (2006.01)
*H01L 21/304* (2006.01)
*H01L 21/82* (2006.01)
*H01L 51/56* (2006.01)

(52) U.S. Cl.
CPC ........ *H01L 51/5012* (2013.01); *H01L 21/3043* (2013.01); *H01L 21/82* (2013.01); *H01L 27/32* (2013.01); *H01L 27/3204* (2013.01); *H01L 51/56* (2013.01)

(58) Field of Classification Search
CPC ..... H01L 21/82; H01L 21/3043; H01L 27/32; H01L 27/3204; H01L 51/56; H01L 51/5012

USPC ............... 257/40, 59, 73, 79, 88, 98, E21.09, 257/E27.119; 438/26, 34, 39, 42, 73, 669; 359/883
See application file for complete search history.

(56) References Cited

U.S. PATENT DOCUMENTS

| 7,474,681 | B2 * | 1/2009 | Lin et al. ..................... 372/43.01 |
| 2007/0284598 | A1 * | 12/2007 | Shakuda et al. ................. 257/93 |
| 2008/0224606 | A1 * | 9/2008 | Kawai et al. ................... 313/504 |
| 2012/0161616 | A1 * | 6/2012 | Yamagishi et al. ............ 313/504 |
| 2013/0249390 | A1 * | 9/2013 | Nishikawa .......... H01L 51/5203 313/512 |
| 2013/0285033 | A1 * | 10/2013 | Nishikawa et al. ............. 257/40 |
| 2014/0353657 | A1 * | 12/2014 | Hayashi ......................... 257/40 |

FOREIGN PATENT DOCUMENTS

| EP | 2473009 A1 | 7/2012 |
| JP | 2008244182 A | 10/2008 |
| JP | 2011134707 A | 7/2011 |
| WO | 2011024951 A1 | 3/2011 |

OTHER PUBLICATIONS

ISA Japanese Patent Office, International Search Report of PCT/JP2012/083061, Apr. 2, 2013, WIPO, 2 pages.
ISA Japanese Patent Office, International Preliminary Report on Patentability and Written Opinion of International Searching Authority of PCT/JP2012/083061, Apr. 2, 2013, WIPO, 6 pages.

* cited by examiner

*Primary Examiner* — Dao H Nguyen
(74) *Attorney, Agent, or Firm* — Alleman Hall McCoy Russell & Tuttle LLP

(57) ABSTRACT

An organic EL device with which occurrence of leakage current between electrodes can be prevented includes: a substrate; a first electrode layer separating groove that separates a first electrode layer into small pieces; a function layer separating groove that separates a function layer into small light emitting regions; and a unit light emitting element separating groove extending from a second electrode layer to the function layer and separating the second electrode layer into small pieces. One of the small pieces of the first electrode layer, one of the small light emitting regions, and one of the small pieces of the second electrode layer structure a unit organic EL element, electrically connected in series. The average width of the unit light emitting element separating groove at the second electrode layer is wider than the average width of the unit light emitting element separating groove at the light emitting portion separating layer.

11 Claims, 13 Drawing Sheets

//ORGANIC EL DEVICE AND MANUFACTURING METHOD THEREOF

TECHNICAL FIELD

The present invention relates to an organic EL (Electro Luminescence) device and a manufacturing method thereof.

BACKGROUND ART

In recent years, organic EL devices have been gathering attention as illumination devices that replace incandescent lamps or fluorescent lamps, and many studies are made thereon.

Here, an organic EL device is a device in which an organic EL element is stacked on a substrate such as a glass substrate or a transparent resin film. The organic EL element is an element in which two electrodes, one or both of which are translucent, oppose each other, and a light emitting layer made of an organic compound is stacked between the electrodes. The organic EL device emits light by using energy from recombination of electrically excited electrons and positive holes.

The organic EL device is a self-luminous device, and can emit light of various wavelengths by selecting the material of the light emitting layer as appropriate. Further, the organic EL device is extremely thin as compared to the incandescent lamp and the fluorescent lamp, and emits light in a planar manner. Therefore, the organic EL device is less restricted as to the installation place.

The representative layer structure of the organic EL device is as shown in FIG. 11. An organic EL device 200 shown in FIG. 11 has the structure referred to as the bottom emission type. On a substrate 201, a transparent electrode layer 202, a function layer (organic light emitting layer) 203, and a back electrode layer 205 are stacked, the layers being sealed by a sealing portion 206 (e.g., Patent Document 1).

Further, the transparent electrode layer 202 is a thin film of metal oxide or the like being stacked. The function layer 203 is made up of a plurality of thin films of organic compounds being stacked. The thickness of the function layer 203 is normally extremely small, i.e., several hundred nanometers. The back electrode layer 205 is a thin film of metal or the like being stacked.

The representative layer structure of the function layer 203 is as shown in FIG. 12. The function layer 203 includes a hole injection layer 210, a hole transportation layer 211, a light emitting layer 212, and an electron transportation layer 213. Further, an electron injection layer is inserted between the electron transportation layer 213 and the back electrode layer 205 as necessary.

That is, light emitted in the function layer (organic light emitting layer) 203 is outputted by transmitting through the lamination structure that structures the organic EL device. In this manner, the organic EL device functions as a self-luminous device.

PATENT DOCUMENT

Patent Document 1: JP 2008-244182 A

DISCLOSURE OF INVENTION

Technical Problem

An organic EL device of the conventional technique has its whole layers structured as shown in FIG. 12. Current is allowed to flow from the entire surface of the transparent electrode layer 202 toward the entire surface of the back electrode layer 205, to cause the light emitting layer 212 of the function layer (organic light emitting layer) 203 interposed therebetween to emit light.

Meanwhile, in the case where a surface light emitting organic EL device such as described above is applied to large-area illumination, the luminance varies from portion to portion. That is, since the transparent electrode layer 202, the function layer 203 and the back electrode layer 205 extend in a planar manner and are thin, it is difficult to achieve an even flow of current over every portion of the surface. Therefore, the portion where current can easily flow attains high luminance, while the portion where current cannot easily flow attains low luminance. Therefore, in order to cause the entire surface to evenly emit light, a strong electric field must be applied throughout, to thereby enhance the current density overall. However, when the current density is enhanced throughout, heat is generated in the organic EL element. The influence of heat accelerates deterioration of the function layer 203.

Further, with the organic EL device of which entire layers are structured as shown in FIG. 12, a high voltage cannot be applied between the transparent electrode layer 202 and the back electrode layer 205. Hence, there exists another problem that the power supply efficiency in supplying the power to the organic EL device is poor.

Accordingly, the inventors of the present invention devised the following effective means for suppressing deterioration of the function layer 203 and improving the power supply efficiency.

That is, the inventors of the present invention devised the following method: dividing an organic EL element into a plurality of small light emitting regions; and connecting the small light emitting regions in series to thereby integrate resistance of each of the small light emitting regions. Thus, the voltage in the organic EL device can be increased without any variations in current density. Then, the inventors tentatively fabricated a plurality of organic EL devices each having the structure in which the organic EL element is divided into a plurality of small light emitting regions in the surface direction of the thin films by a laser scribing apparatus and the small light emitting regions are connected in series.

Specifically, as shown in FIG. 14A, the layers were irradiated with a laser beam from the substrate 201 side. Thus, an organic EL device including a plurality of divided unit organic EL elements 220 as shown in FIG. 13 was tentatively fabricated (hereinafter referred to as Prototype 1).

The layer structure of the tentatively fabricated organic EL devices are each identical to the basic structure of the organic EL device described above. That is, the transparent electrode layer 202, the function layer 203 and the back electrode layer 205 are successively stacked on the substrate 201 as shown in FIG. 13. On the other hand, grooves 215, 216, and 217 are formed in the respective layers.

That is, the transparent electrode layer separating groove 215 is formed in the transparent electrode layer 202, whereby the transparent electrode layer 202 is divided into a plurality of pieces. Further, the function layer separating groove 216 is formed in the function layer 203, whereby the function layer 203 is divided into a plurality of pieces. Still further, a portion of the back electrode layer 205 enters inside the function layer separating groove 216, to be brought into contact with the transparent electrode layer 202 at the bottom of the groove.

Still further, in the function layer 203 and the back electrode layer 205, the unit light emitting element separating groove 217 that penetrates both the function layer 203 and the back electrode layer 205 is formed.

Note that in the present description, each "unit organic EL element 220" is structured by a small piece of the transparent electrode layer (first electrode layer) 202 divided by the transparent electrode layer separating groove 215, small light emitting regions each divided by the function layer separating groove 216, and a small piece of the back electrode layer (second electrode layer) 205 divided by the unit light emitting element separating groove 217. More precisely, the unit organic EL element 220 is the portion represented by solid lines in FIG. 15.

Further, each "unit organic EL element 220" emits light by the function layer 203 interposed between a small piece of the transparent electrode layer (first electrode layer) 202 and a small piece of the back electrode layer (second electrode layer) 205 and functioning as a unit light emitting portion 230.

In connection with the organic EL device, as shown in FIG. 13, the thin films are partitioned by the transparent electrode layer separating groove 215 provided on the transparent electrode layer 202 and the unit light emitting element separating groove 217 that penetrates both the function layer 203 and the back electrode layer 205, whereby each independent unit organic EL element 220 is formed. Then, as described above, a portion of the back electrode layer 205 enters inside the function layer separating groove 215, whereby a connection portion 231 is structured. This portion of the back electrode layer 205 is in contact with the transparent conductive layer 202. That is, one unit organic EL element 220a is electrically connected in series with an adjacent unit organic EL element 220b. More precisely, the unit light emitting portions 230 are electrically connected in series via the connection portion 231.

That is, when the organic EL device 200 is energized from an external power supply, current flows from the transparent electrode layer 202 side toward the back electrode layer 205 side. Since the back electrode layer 205 is partly in contact with the transparent electrode layer 202 via the function layer separating groove 216, the current having flowed through the first unit EL element flows through the transparent electrode layer 202 of the next unit EL element. Therefore, the resistance accumulates successively, and a high voltage can be applied as a whole.

In connection with Prototype 1, using a laser scribing apparatus as shown in FIG. 14A, the layers were irradiated with a laser beam from the substrate 201 side. Thus, both the back electrode layer 205 and the function layer 203 were partly removed. Thus, the unit light emitting element separating groove 217 was provided.

However, as described above, since the function layer 203 is made up of extremely thin organic compound films, adhesion with the transparent electrode layer 202 is poor and heat resistance is also poor. Therefore, with the organic EL device of Prototype 1, when the unit light emitting element separating groove 217 for separating the unit organic EL element 220 is formed, the function layer 203 is removed more widely than the back electrode layer 205, whereby a burr is formed on the back electrode layer 205. Then, in some cases, when the burr on the back electrode layer 205 enters inside the unit light emitting element separating groove 217 and is brought into contact with the transparent electrode layer 202, leakage current occurs.

Further, in some cases, when the processing power is increased in accordance with the material or thickness of the back electrode layer 205, the transparent electrode layer 202 is damaged.

Accordingly, the present invention has been made to solve the problems described above, and an object of the present invention is to develop an organic EL device and a manufacturing method thereof with which occurrence of leakage current between electrodes can be prevented and the transparent electrode layer can be processed without being damaged.

Solution to Problem

The invention for solving the problem described above is an organic EL device including: a substrate, at least a first electrode layer, an organic light emitting layer, and a second electrode layer being stacked on the substrate; a first electrode layer separating groove that separates the first electrode layer into a plurality of small pieces; a unit light emitting element separating groove that has a depth extending from the second electrode layer to trench the organic light emitting layer, the unit light emitting element separating groove separating the second electrode layer into a plurality of small pieces; and a connection portion that penetrates through the organic light emitting layer to connect between the second electrode layer and the first electrode layer, one of the small pieces of the first electrode layer, one of the small pieces of the second electrode layer, and a portion of the organic light emitting layer therebetween structuring a unit light emitting portion, the unit light emitting portion being electrically connected in series via the connection portion, wherein an average groove width of the unit light emitting element separating groove at a portion corresponding to the second electrode layer is wider than an average groove width of the unit light emitting element separating groove at a portion corresponding to the organic light emitting layer.

Another invention for solving a similar problem is an organic EL device including: a substrate, at least a first electrode layer, an organic light emitting layer, and a second electrode layer being stacked on the substrate; a first electrode layer separating groove that separates the first electrode layer into a plurality of small pieces; a light emission separating groove that separates the organic light emitting layer into a plurality of small light emitting regions; and a unit light emitting element separating groove that has a depth extending from the second electrode layer to reach the organic light emitting layer, the unit light emitting element separating groove separating the second electrode layer into a plurality of small pieces, one of the small pieces of the first electrode layer, one of the small light emitting regions and one of the small pieces of the second electrode layer structuring a unit EL element, the unit EL element being electrically connected in series, wherein an average groove width of the unit light emitting element separating groove at a portion corresponding to the second electrode layer is wider than an average groove width of the unit light emitting element separating groove at a portion corresponding to the organic light emitting layer.

With the structure of the present invention, since the average groove width of the unit light emitting element separating groove at the portion corresponding to the second electrode layer is wider than the average groove width of the unit light emitting element separating groove at the portion corresponding to the organic light emitting layer, it becomes possible to increase the distance between the first electrode layer and the second electrode layer near the unit light emitting element separating groove. Therefore, even when a burr is formed near the unit light emitting element separating groove at the portion corresponding to the second electrode layer and enters inside the unit light emitting element separating groove, the burr can be prevented from reaching the unit light emitting element separating groove at a portion corresponding to the first electrode layer because the distance between the first electrode layer and the second electrode layer is great. That is, it becomes possible to prevent the first electrode layer and the second electrode layer from being brought into contact each other, and to prevent occurrence of leakage current.

In the invention described above, it is desirable that a boundary in the unit light emitting element separating groove between the portion corresponding to the second electrode layer and the portion corresponding to the organic light emitting layer is stepwise.

With such a structure, the distance between the first electrode layer and the second electrode layer can be surely widened. That is, leakage current does not easily occur.

Further, it is preferable that the average groove width of the unit light emitting element separating groove at the portion corresponding to the second electrode layer is 1.3 to 2.0 times as great as the average groove width of the unit light emitting element separating groove at the portion corresponding to the organic light emitting layer.

Meanwhile, in manufacturing the organic EL device, as in the case of Prototype 1, when the layers are irradiated with a laser beam from the substrate 201 side, to thereby form the unit light emitting element separating groove 217, a burr is formed. Accordingly, the inventors arrived at the idea of suppressing forming of a burr by irradiating the layers with a laser beam from the back electrode layer 205 side. Then, the inventors had the layers irradiated with a laser beam from the back electrode layer 205 side to thereby tentatively fabricate an organic EL device made up of a plurality of divided unit organic EL elements 220 (hereinafter referred to as Prototype 2). That is, the manufacturing method of Prototype 1 and the manufacturing method of Prototype 2 are different in the radiation direction of the laser beam in forming the unit light emitting element separating groove 217 that divides one organic EL element into a plurality of unit EL elements.

More specifically, in the manufacturing method of Prototype 2, as shown in FIG. 14B, using a laser scribing apparatus, the layers were irradiated with a laser beam from the back electrode layer 205 side, and both the back electrode layer 205 and the function layer 203 were partly removed to thereby provide the unit light emitting element separating groove 217.

In the manufacturing method of Prototype 2, in forming the unit light emitting element separating groove 217 that separates each unit organic EL element 220, both the back electrode layer 205 and the function layer 203 are simultaneously removed. To this end, the layers must be irradiated with a laser beam, to melt the back electrode layer 205 and further the function layer 203. When the layers are irradiated from the back electrode layer 205 side with a laser beam of energy that is so great that both the back electrode layer 205 and the function layer 203 are melted, no burr is formed on the back electrode layer 205. However, when the energy is excessively applied to the back electrode layer 205, the energy is accumulated in the back electrode layer 205 near the unit light emitting element separating groove 217, whereby heat is generated. Then, as described above, a conductor such as metal is used in the back electrode layer 205, and thus the heat generated near the unit light emitting element separating groove 217 is conducted through the back electrode layer 205. That is, at a portion other than the unit light emitting element separating groove 217, the function layer 203 is thermally damaged by the back electrode layer 205. Accordingly, the thermally damaged portion of the function layer 203 may accelerate deterioration.

The invention relating to a manufacturing method derived by the foregoing found after much trial and error is a manufacturing method of the organic EL device including a step of forming the unit light emitting element separating groove by performing radiation of a laser beam from the second electrode layer side at least twice.

Another invention relating to a manufacturing method is a manufacturing method of an organic EL device that includes: a substrate, at least a first electrode layer, an organic light emitting layer, and a second electrode layer being stacked on the substrate; a first electrode layer separating groove that separates the first electrode layer into a plurality of small pieces; a unit light emitting element separating groove that has a depth extending from the second electrode layer to trench the organic light emitting layer, the unit light emitting element separating groove separating the second electrode layer into a plurality of small pieces; and a connection portion that penetrates through the organic light emitting layer to connect between the second electrode layer and the first electrode layer, one of the small pieces of the first electrode layer, one of the small pieces of the second electrode layer, and a portion of the organic light emitting layer therebetween structuring a unit light emitting portion, the unit light emitting portion being electrically connected in series via the connection portion, the method including a step of forming the unit light emitting element separating groove by performing radiation of a laser beam from the second electrode layer side at least twice, the step including a first laser irradiation step of forming a groove at least on the second electrode layer and a second laser irradiation step of irradiating an inside of the groove formed by the first laser irradiation step with a laser beam, wherein the laser beam used in the first laser irradiation step and the laser beam used in the second laser irradiation step are different in a radiation area.

Still another invention relating to a manufacturing method is a manufacturing method of an organic EL device that includes: a substrate, at least a first electrode layer, an organic light emitting layer, and a second electrode layer being stacked on the substrate; a first electrode layer separating groove that separates the first electrode layer into a plurality of small pieces; a light emission separating groove that separates the organic light emitting layer into a plurality of small light emitting regions; and a unit light emitting element separating groove that has a depth extending from the second electrode layer to reach the organic light emitting layer, the unit light emitting element separating groove separating the second electrode layer into a plurality of small pieces, one of the small pieces of the first electrode layer, one of the small light emitting regions and one of the small pieces of the second electrode layer structuring a unit EL element, the unit EL element being electrically connected in series, the method including a step of forming the unit light emitting element separating groove by performing radiation of a laser beam from the second electrode layer side at least twice, the step including a first laser irradiation step of forming a groove at least on the second electrode layer and a second laser irradiation step of irradiating an inside of the groove formed by the first laser irradiation step with a laser beam, wherein the laser beam used in the first laser irradiation step and the laser beam used in the second laser irradiation step are different in a radiation area.

Each method described above includes: a step of forming the unit light emitting element separating groove by performing radiation of a laser beam from the second electrode layer side at least twice, the step including a first laser irradiation step of forming a groove at least on the second electrode layer, and a second laser irradiation step of irradiating an inside of the groove formed by the first laser irradiation step with a laser beam. The laser beam used in the first laser irradiation step and the laser beam used in the second laser irradiation step are different in a radiation area. That is, with the laser beam used in the second laser irradiation step, the inside of the groove is irradiated. Therefore, an organic EL device in which the average groove width of the unit light emitting element separating groove at the portion corresponding to the second electrode layer is wider than the average groove width of the unit light emitting element separating groove at the portion corresponding to the organic light emitting layer can be manufactured.

Further, according to the method of the present invention, in forming the unit light emitting element separating groove, the second electrode layer and the organic light emitting layer are not removed simultaneously. Instead, the second electrode layer and the organic light emitting layer are removed at separate times. For example, in the first laser irradiation step, the second electrode layer is removed by energy of the magnitude with which the organic light emitting layer is not reached, i.e., by the energy that can be absorbed solely by the second electrode layer. Thereafter, in the second laser irradiation step, by removing only the organic light emitting layer, the organic EL device can be manufactured without applying excessive energy to the second electrode layer. Then, since manufacturing can be carried out without applying excessive energy to the second electrode layer, generation of heat inside the second electrode layer can be suppressed. That is, the organic EL device can be manufactured without thermally damaging the organic light emitting layer. In other words, the manufacturing method of the organic EL device of the present invention does not easily impair the organic light emitting layer. Further, since the step of forming the unit light emitting element separating groove is performed by performing radiation of a laser beam from the second electrode layer side at least twice, it becomes possible to prevent formation of a burr that enters inside the unit light emitting element separating groove to reach the first electrode layer. That is, occurrence of leakage current can be prevented.

Further, preferably, in each manufacturing method described above, the laser beam used in the first laser irradiation step and the laser beam used in the second laser irradiation step are different in at least one of a wavelength, power, and a pulse radiation time.

Still further, preferably, power of the laser beam used in the first laser irradiation step is greater than power of the laser beam used in the second laser irradiation step.

Still further, preferably, in each manufacturing method described above, a beam width of the laser beam used in the first laser irradiation step is greater than a beam width of the laser beam used in the second laser irradiation step.

As used herein, the "beam width" represents the width of the laser beam on the irradiation-target object, such as the substrate.

A specific invention for realizing the manufacturing method described above is the manufacturing method of the organic EL device in which the step of forming the unit light emitting element separating groove is performed by performing radiation of the laser beam from the second electrode layer side and shifting an irradiation position of the laser beam, the laser beam being split into at least two beams from a common laser beam source. Irradiation positions of the laser beams split into at least two are shifted to and fro in a moving direction of the irradiation positions of the laser beams. The first laser irradiation step is performed by one of the laser beams that is firstly caused to radiate, and the second laser irradiation step is performed by other one of the laser beams that is subsequently caused to radiate.

According to such a method, the portion of the unit light emitting element separating groove corresponding to the second electrode layer and the portion of the unit light emitting element separating groove corresponding to the organic light emitting layer can be simultaneously formed in one step.

Further, preferably, in each manufacturing method described above, a wavelength of the laser beam used in the first laser irradiation step is shorter than a wavelength of the laser beam used in the second laser irradiation step.

Specifically, preferably, the wavelength of the laser beam used in the first laser irradiation step is 355 nm, and the wavelength of the laser beam used in the second laser irradiation step is 532 nm.

Further, the laser beam used in the first laser irradiation step and the laser beam used in the second laser irradiation step are radiated upward in a top-bottom direction.

According to such a method, the laser beam used in the first laser irradiation step and the laser beam used in the second laser irradiation step are radiated upward in the top-bottom direction. That is, relative to the light source of the laser beam, the second electrode layer is positioned on the upper side in the top-bottom direction. Accordingly, since impurities such as shavings (the organic light emitting layer, the second electrode layer, and the like) and dust that are generated during the first laser irradiation step and the second laser irradiation step fall from the substrate by gravitation, the impurities do not easily remain on the substrate. That is, unevenness does not easily appear on the substrate, making it difficult for the leakage current to flow. Therefore, it becomes possible to suppress occurrence of light emission defects.

A wavelength of the laser beam used in the first laser irradiation step may be outside a visible region.

Advantageous Effect of Invention

With the organic EL device of the present invention, since the average groove width of the unit light emitting element separating groove at a portion corresponding to the second electrode layer portion is wider than the average groove width of the unit light emitting element separating groove at a portion corresponding to the organic light emitting layer portion, an occurrence of leakage current between the electrodes can be prevented.

According to the manufacturing method of the present invention, since the layers are irradiated with a laser beam from the second electrode layer side at least twice, occurrence of a burr that enters inside the unit light emitting element separating groove to reach the first electrode layer can be prevented. That is, occurrence of leakage current can be prevented.

BRIEF DESCRIPTION OF DRAWINGS

FIGS. 14A and 14B are explanatory views of formation of a unit light emitting element separating groove of each of Prototype 1 and Prototype 2, in which FIG. 14A shows Prototype 1 and FIG. 14B shows Prototype 2.

DESCRIPTION OF EMBODIMENT

Figure 1:
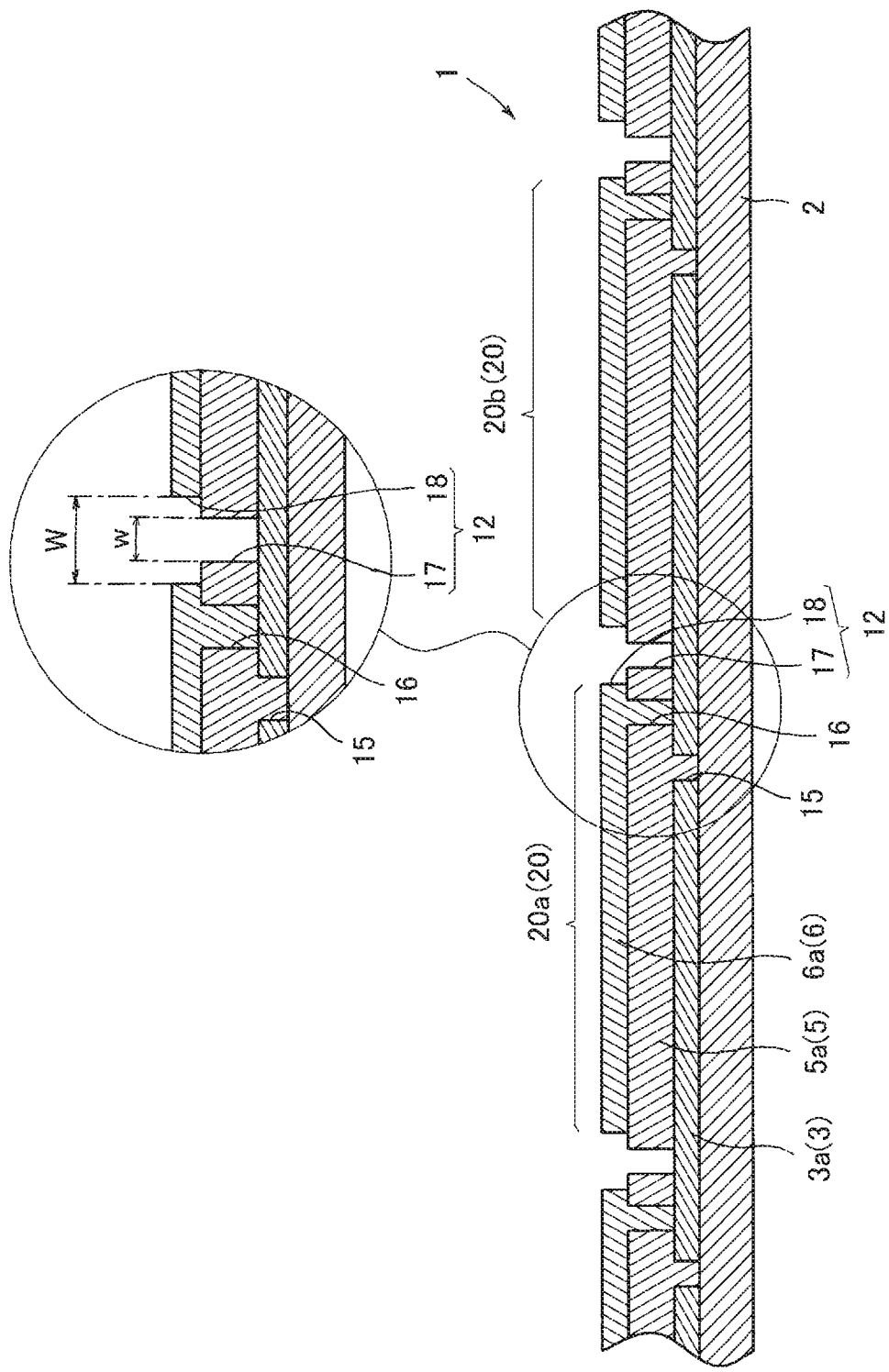
FIG. 1 is a cross-sectional view of an organic EL device according to an embodiment of the present invention with its back side up.

The present invention relates to an organic EL device and a manufacturing method of the organic EL device. FIG. 1 shows an organic EL device 1 according to a first embodiment of the present invention.

As shown in FIG. 1, the organic EL device 1 has substantially the same layer structure as that of Prototype 1 and Prototype 2 described above. That is, on one side of a substrate 2 (a base member), a first electrode layer 3, a function layer 5 (an organic light emitting layer), and a second electrode layer 6 are stacked in this order, and sealed by a sealing portion, not-shown. Note that the organic EL device 1 excluding the sealing member is referred to as an organic EL element (a stack).

Further, as shown in FIG. 1, the first electrode layer 3 is provided with a "first electrode layer separating groove" 15 formed by removal of the first electrode layer 3. The function layer 5 is provided with a "function layer separating groove" 16 (a light emission separating groove) and a "light emitting portion separating groove" 17 formed by removal of the function layer 5. Further, the second electrode layer 6 is provided with a "second electrode layer separating groove" 18 formed by removal of the second electrode layer 6.

Then, the light emitting portion separating groove 17 formed by the removal of the function layer 5 and the second electrode layer separating groove 18 formed by the removal of the second electrode layer 6 are located at the same position and communicate with each other. The boundary between the light emitting portion separating groove 17 and the second electrode layer separating groove 18 is stepwise, and the light emitting portion separating groove 17 and the second electrode layer separating groove 18 form one "unit light emitting element separating groove" 12 as a whole. That is, the inner wall surface of the light emitting portion separating groove 17 and the inner wall surface of the second electrode layer separating groove 18 do not form an identical plane.

Note that in the present embodiment, the depth of the unit light emitting element separating groove 12 extends from the second electrode layer 6 to first reach the function layer (organic light emitting layer) 5, and then further trenches the function layer 5 to reach the first electrode layer 3.

Then, similarly to Prototype 1 and Prototype 2 described above, in the organic EL device 1, the thin films are partitioned by the first electrode layer separating groove 15 and the unit light emitting element separating groove 12, whereby independent unit organic EL elements 20 are formed.

Figure 9:
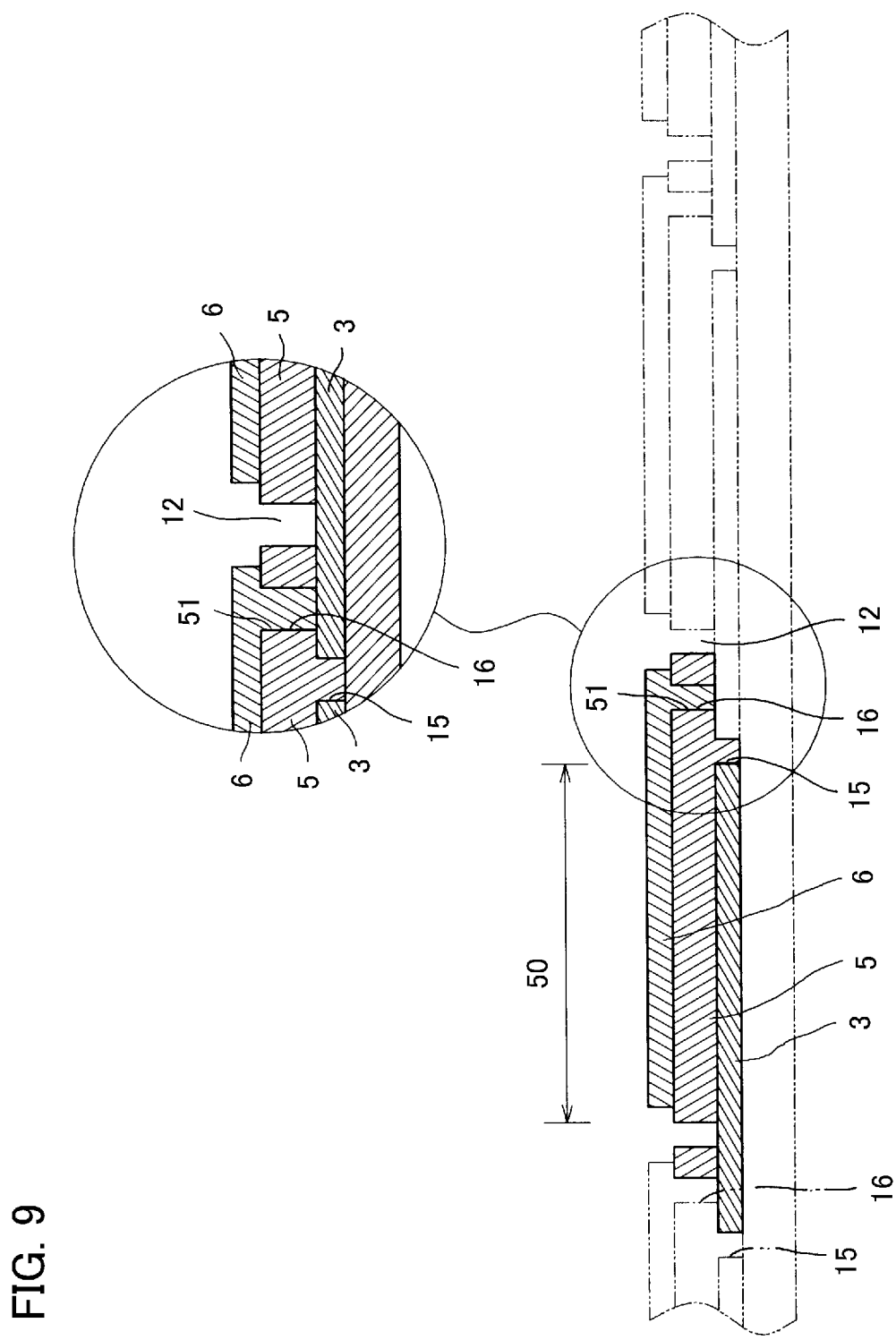
FIG. 9 is a cross-sectional view of one unit EL element, which is represented by solid lines, in the organic EL device according to the embodiment of the present invention.

Precisely, a unit organic EL element 20 is the portion represented by the solid lines in FIG. 9, which is the region structured by a small piece of the first electrode layer 3 divided by the first electrode layer separating groove 15, small light emitting regions of the function layer 5 each divided by the function layer separating groove 16, and a small piece of the second electrode layer 6 divided by the unit light emitting element separating groove 12.

Further, in the present embodiment, the unit organic EL element 20 emits light by the function layer 5 interposed between the small piece of the first electrode layer 3 and the small piece of the second electrode layer 6 and functioning as a unit light emitting portion 50.

Then, a portion of a second electrode layer 6a enters inside the function layer separating groove 16, whereby a connection portion 51 is structured. This portion of the second electrode layer 6a is in contact with the adjacent first electrode layer 3b. That is, one unit organic EL element 20a is electrically connected in series with an adjacent unit organic EL element 20b via the connection portion 51.

The width in the integration direction (string width) of the unit organic EL element 20a is preferably 2 mm to 40 mm, more preferably 5 mm to 30 mm, and even more preferably 10 to 20 mm.

Here, a detailed description will be given on the light emitting portion separating groove 17 and the second electrode layer separating groove 18.

Note that in the following description, the light emitting portion separating groove 17 and the second electrode layer separating groove 18 are collectively referred to also as the unit light emitting element separating groove 12.

The average groove width W of the unit light emitting element separating groove 12 at a portion corresponding to the second electrode layer (i.e., the second electrode layer separating groove 18) is greater than the average groove width w of the unit light emitting element separating groove 12 at a portion corresponding to the function layer (i.e., the light emitting portion separating groove 17). Specifically, the average groove width W of the second electrode layer separating groove 18 is preferably 1.3 times to 2.0 times greater than the average groove width w of the light emitting portion separating groove 17. More preferably, the average groove width W is 1.4 times to 1.8 times greater than the average groove width w, and particularly preferably 1.5 times to 1.7 times greater. The average groove width W of the second electrode layer separating groove 18 is preferably 30 μm to 80 μm. More preferably, the average groove width W is 40 μm to 70 μm, and particularly preferably 45 μm to 60 μm.

Next, a description will be given on a manufacturing method of the organic EL device 1 according to the present embodiment mainly with reference to FIGS. 2A to 2H.

The organic EL device 1 is manufactured mainly using a vacuum deposition apparatus, a plasma CVD apparatus, or a laser scribing apparatus, each of which are not shown.

Figure 2A:
FIGS. 2A to 2H are schematic views showing the manufacturing steps of the organic EL device shown in FIG. 1, in which FIGS. 2A to 2H each show a cross-sectional view of the corresponding step.
Figure 2B:
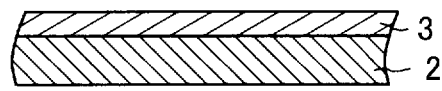

Firstly, the first electrode layer 3 is deposited on the substrate 2 (FIGS. 2A to 2B).

Here, the surface of the employed substrate 2 is entirely smooth. Even after the first electrode layer 3 is deposited, the entire surface is smooth.

Figure 2C:
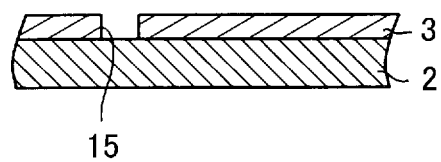

Subsequently, the first laser scribing step is performed, to form the first electrode layer separating groove 15 at the first electrode layer 3 (FIGS. 2B to 2C).

Note that the laser scribing apparatus employed in the first laser scribing step is a known laser scribing apparatus, and has an XY table, a laser producing apparatus, and an optical member. In the first laser scribing step, the substrate 2 is placed on the XY table. The substrate 2 is linearly shifted in a longitudinal direction at a constant speed while being irradiated with a laser beam, whereby one or more grooves are formed. Thereafter, laser beam irradiation is temporarily stopped, and the XY table is returned to the irradiation start position of the groove(s). Then, the XY table is shifted in a lateral direction to displace the irradiation position of the laser beam. The substrate 2 is again linearly shifted in the longitudinal direction while being irradiated with a laser beam, whereby a groove being parallel to the aforementioned groove(s) is formed.

Further, though the laser beam in forming the first electrode layer separating groove 15 can be arbitrarily selected, YAG (yttrium aluminum garnet), $YVO_4$ (yttrium vanadate, yttrium orthovanadate), YLF (yttrium lithium fluoride), or a fiber laser can be employed.

Still further, as the laser beam for forming the first electrode layer separating groove 15, a laser beam other than visible light can be employed. Specifically, a laser beam with a wavelength of 200 to 380 nm or 780 to 1100 nm is preferable. A laser beam with a wavelength of 355 nm or 1064 nm is more preferable.

Further, energy distribution of the laser beam is not particularly limited. That is, a laser beam having a bell-shaped energy distribution, which is referred to as the Gaussian type, or a laser beam having a uniform energy distribution, which is referred to as the top-hat type, may be employed.

The laser scribing apparatus used in the first laser scribing step employs pulse oscillation and irradiates the laser beam using constant pulse signals by shifting a relative position between the laser beam irradiation position and the substrate by means of the XY table, as described above, thus forming the first electrode layer separating groove 15 in the form of pits each having a substantially identical shape aligned at a constant pitch.

The surface of the substrate having undergone the first laser scribing step is cleaned as necessary in order to remove the scattered coat pieces. Note that any known cleaning method can be employed.

Next, the substrate is inserted into the vacuum deposition apparatus, and the hole injection layer, the hole transportation layer, the light emitting layer, the electron transportation layer, and the like are deposited successively. Then, the function layer 5 is formed. Thereafter, as necessary, a thin second electrode layer 6 is deposited on the function layer 5 (FIGS. 2C to 2D).

Specifically, it is preferable to deposit the thin second electrode layer 6 being 1/10 to 1/2 times as thick as the total thickness of the second electrode layer 6 at the completion of the organic EL device 1. Thus, the second electrode layer 6 functions as a protection layer for protecting the function layer 5 during the second laser scribing step.

Figure 2D:
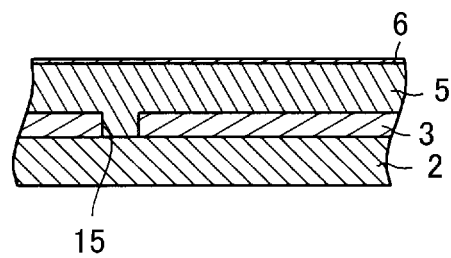
Figure 2E:
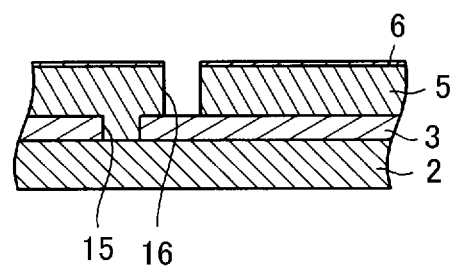

Then, with the substrate taken out from the vacuum deposition apparatus, the second laser scribing step is performed, whereby the function layer separating groove 16 is formed on the function layer 5 (FIGS. 2D to 2E).

Further, a laser beam with a wavelength of 200 to 1100 nm can be employed. A laser beam with a wavelength of 200 to 380 nm is preferable. A laser beam with a wavelength of 355 nm is particularly preferable.

Note that though the laser beam in forming the function layer separating groove 16 can be arbitrarily selected, YAG, $YVO_4$, YLF, or a fiber laser can be employed. For example, with the YAG laser of great versatility, an nth harmonic laser beam (n=2 to 3) can be used.

Further, from the viewpoint of unlikeliness of occurrence of a large burr, a laser beam having a beam shape referred to as the top-hat shape, in which the energy distribution is uniform, is preferable.

Still further, from the viewpoint of suppressing impairment of the function layer 5, in forming the function layer separating groove 16, the laser beam irradiation is preferably performed from the second electrode layer 6 side (the side being opposite to the substrate 2).

Figure 2F:
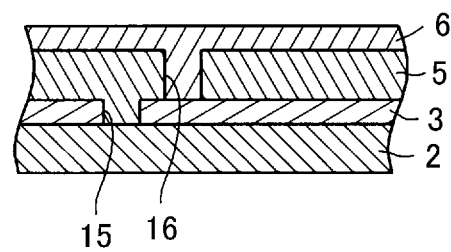

Subsequently, the substrate is inserted into the vacuum deposition apparatus, and the second electrode layer 6 is formed on the function layer 5 (preferably, on the second electrode layer 6 having been deposited by a small thickness) (FIGS. 2E to 2F).

Then, the third laser scribing step of forming the unit light emitting element separating groove 12 being the characteristic of the present invention is performed. In the third laser scribing step, the light emitting portion separating groove 17 formed by removal of the function layer 5 and the second electrode layer separating groove 18 formed by removal of the second electrode layer 6 are formed.

Figure 2G:
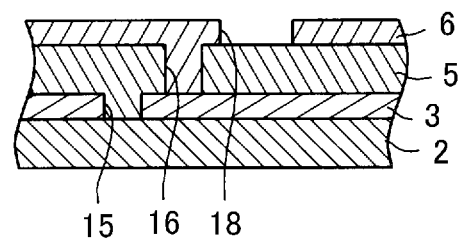
Figure 2H:
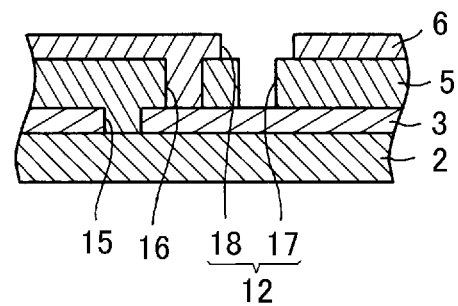

Specifically, the third laser scribing step is carried out by performing laser beam irradiation from the second electrode layer 6 side at least twice. Specifically, the third laser scribing step includes the first laser irradiation step of forming the second electrode layer separating groove 18 on the second electrode layer 6 (FIGS. 2F to 2G), and the second laser irradiation step of forming the light emitting portion separating groove 17 by irradiating inside the second electrode layer separating groove 18 formed by the first laser irradiation step with a laser beam (FIGS. 2G to 2H). Further, in the third laser scribing step of the present embodiment, the first laser irradiation step and the second laser irradiation step are substantially simultaneously performed. In more detail, they are performed with a slight time interval.

Note that the laser scribing apparatus 30 used in the third laser scribing step is different from the laser scribing apparatus used in the first and the second laser scribing steps.

Figure 3:
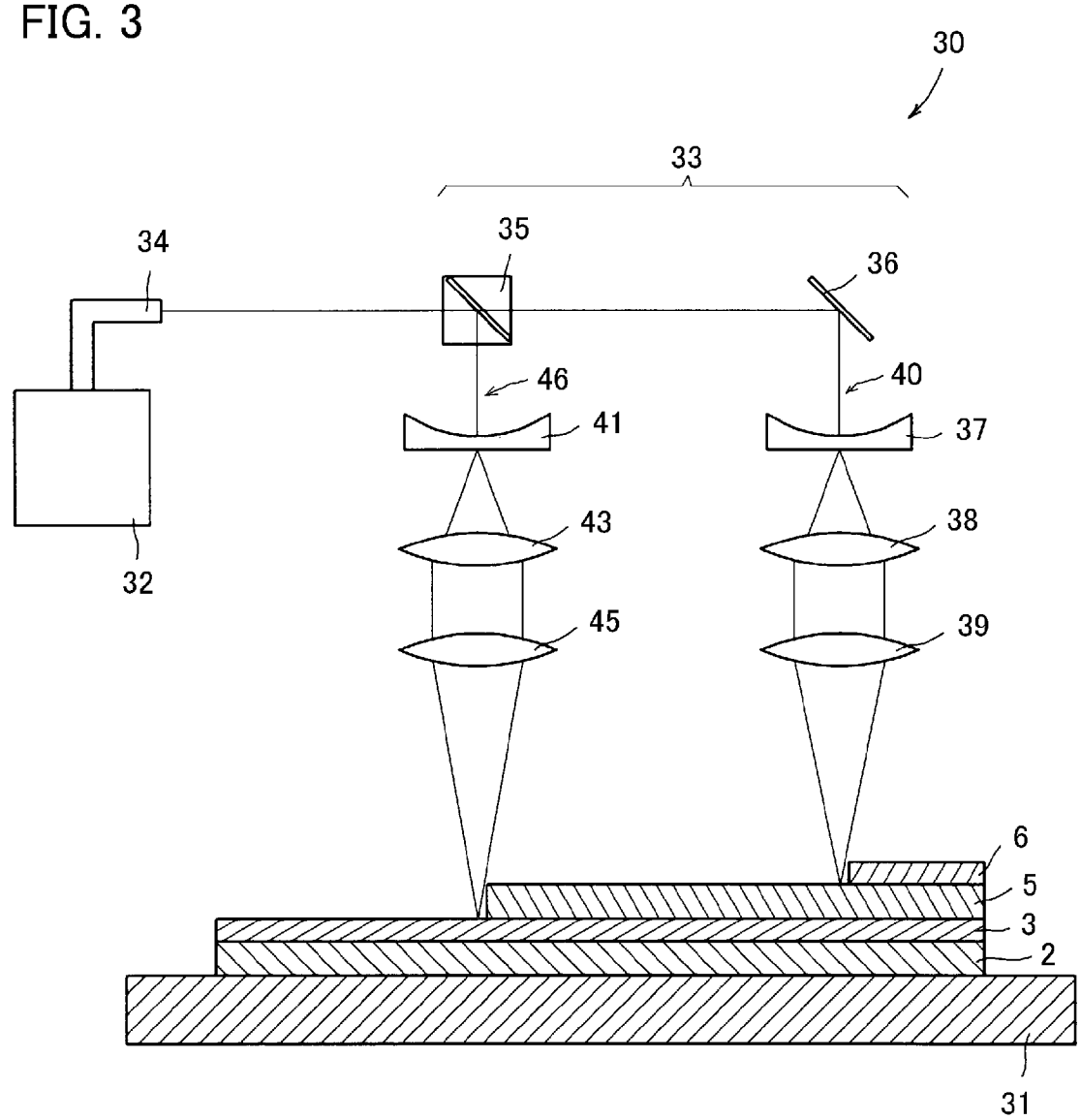
FIG. 3 is a schematic view of a laser scribing apparatus that is used in manufacturing the organic EL device shown in FIG. 1.

In more detail, though the laser scribing apparatus 30 used in the third laser scribing step includes a XY table 31, a laser producing apparatus 32, and an optical member 33 similarly to the laser scribing apparatus used in the first and the second laser scribing steps as shown in FIG. 3, the laser scribing apparatus 30 splits a laser beam into two or more laser beams. Further, the irradiation positions of the respective two or more split laser beams are fixed as being displaced from each other. Then, the substrate to be placed under irradiation is shifted by the XY table 31 in the direction along which a groove is to be formed, to achieve scribing.

More specifically, the laser scribing apparatus 30 is as shown in FIG. 3, and is structured by the laser producing apparatus 32 and the optical member 33.

The laser producing apparatus 32 is a laser producing apparatus that produces known laser such as YAG, $YVO_4$, YLF, a fiber laser, or the like. For example, with a YAG laser of great versatility, an nth harmonic laser beam (n=2 to 3) can be produced.

Further, a laser beam with a wavelength from 200 to 1100 nm can be employed. A laser beam with a wavelength of 200 to 380 nm is preferable. A laser beam with a wavelength of 355 nm is particularly preferable. Further, in the present embodiment, from the viewpoint of unlikeliness of occurrence of a large burr, the top-hat shape laser beam having a beam shape in which energy distribution is uniform is used.

Still further, the average output of the laser beam is preferably 0.8 W to 2.0 W. The average output of the laser beam is more preferably 1.0 W to 1.8 W, and is particularly preferably 1.2 W to 1.6 W.

Still further, the laser producing apparatus 32 uses pulsed oscillation, and generates a laser beam according to pulse signals of a prescribed frequency. Specifically, the pulse width of the pulse signal is preferably 200 fsec to 100 nsec. The pulse width is more preferably 10 psec to 10 nsec. The pulse width is particularly preferably 2 nsec to 6 nsec. Since the pulse width is relatively small, energy load put on the substrate during laser beam irradiation is small.

The optical member 33 is branched into two optical paths via the beam splitter 35. The optical member 33 has, with reference to the flow direction of the laser beam, a first optical path 40 in which an optical reflective mirror 36 (or a prism 36), a concave lens 37, a convex lens 38, and a convex lens 39 are successively arranged in order from the beam splitter 35 side as shown in FIG. 4, and a second optical path 46 in which a concave lens 41, a convex lens 43, and a convex lens 45 are successively arranged in order from the beam splitter 35 side as shown in FIG. 5.

A description will be given on the flow of the laser beam. As shown in FIGS. 3, 4, and 5, the laser beam generated from the laser producing apparatus, 32 transmits through the optical fiber 34, and arrives at the beam splitter 35. Then, by the beam splitter 35, the laser beam is split into the first laser beam (transmitting light) that forms the second electrode layer separating groove 18 and the second laser beam (reflected light) that forms the light emitting portion separating groove 17 at a prescribed ratio.

Figure 4:
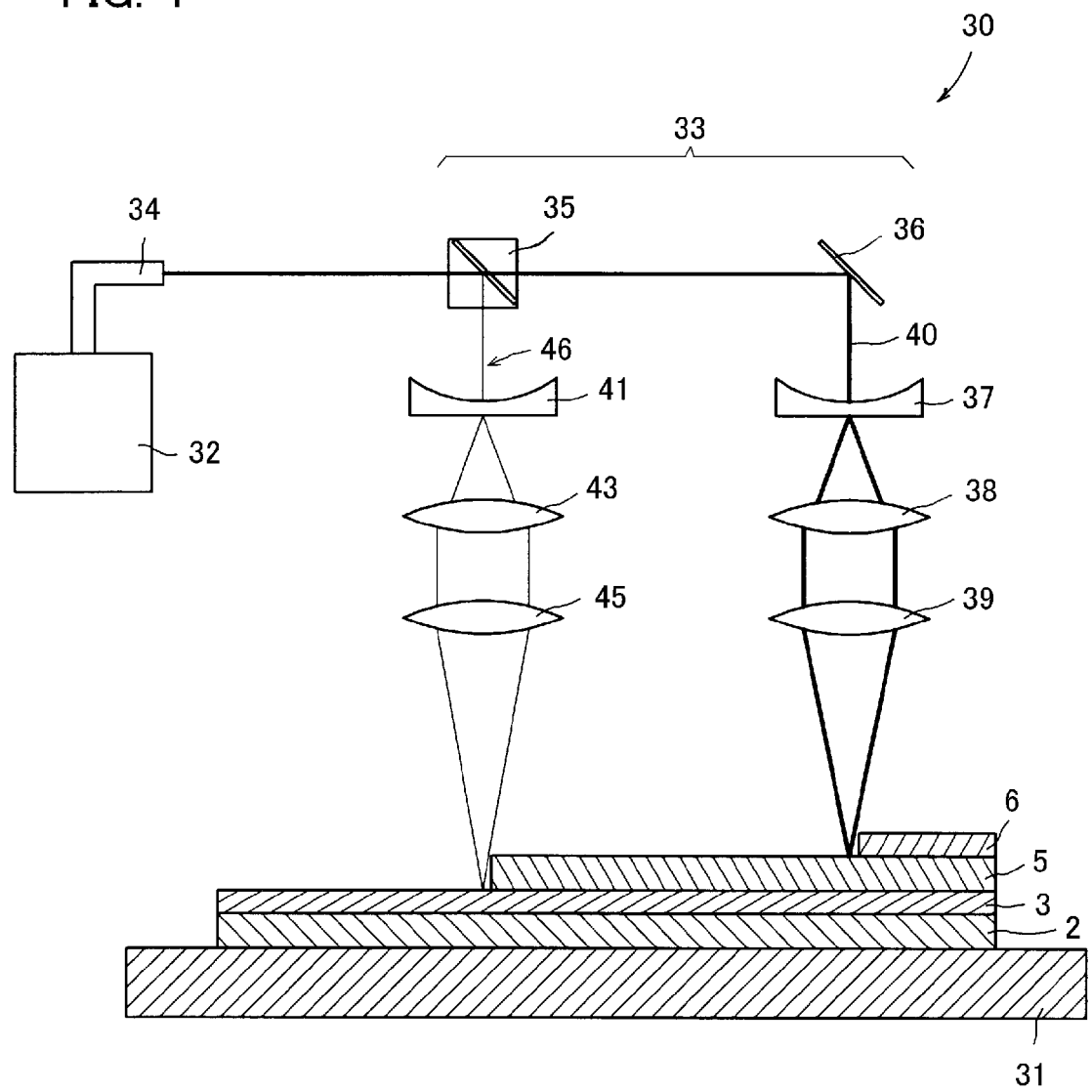
FIG. 4 is an explanatory view showing the flow of the laser beams of the laser scribing apparatus shown in FIG. 3, in which the first optical path is represented by a bold line.

Then, as shown in FIG. 4, the substrate is irradiated with the first laser beam from the second electrode layer 6 side through the first optical path 40. Specifically, the first laser beam has its direction changed by the optical reflective mirror 36 (or the prism 36). Then the first laser beam is magnified by the concave lens 37, and enters the convex lens 38. At the convex lens 38, the first laser beam is converted into a collimated beam. Then, the first laser beam converted into the collimated beam is condensed by the convex lens (objective lens) 39 and the substrate is irradiated therewith.

Figure 5:
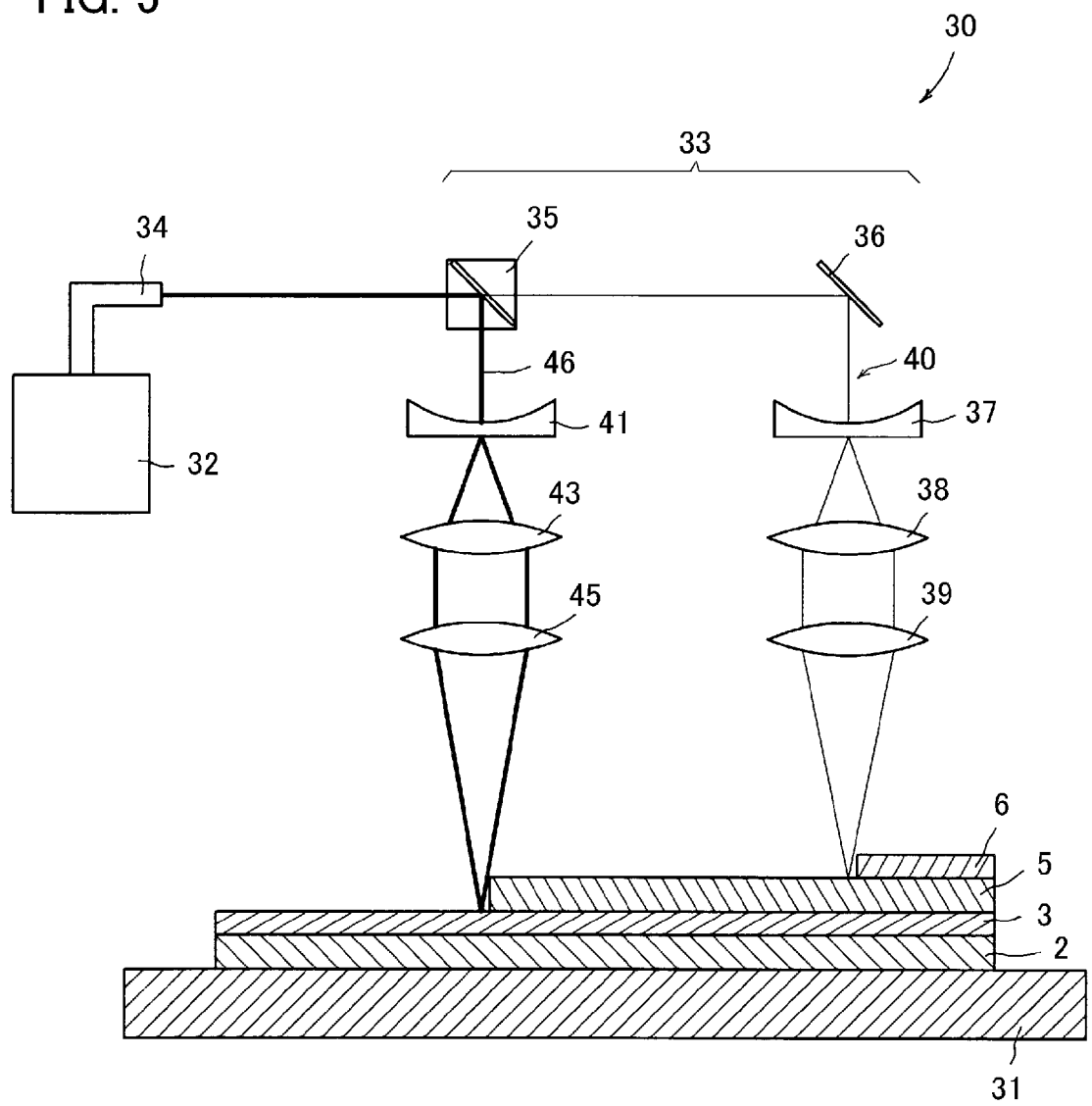
FIG. 5 is an explanatory view showing the flow of the laser beams of the laser scribing apparatus shown in FIG. 3, in which the second optical path is represented by a bold line.
Figure 6:
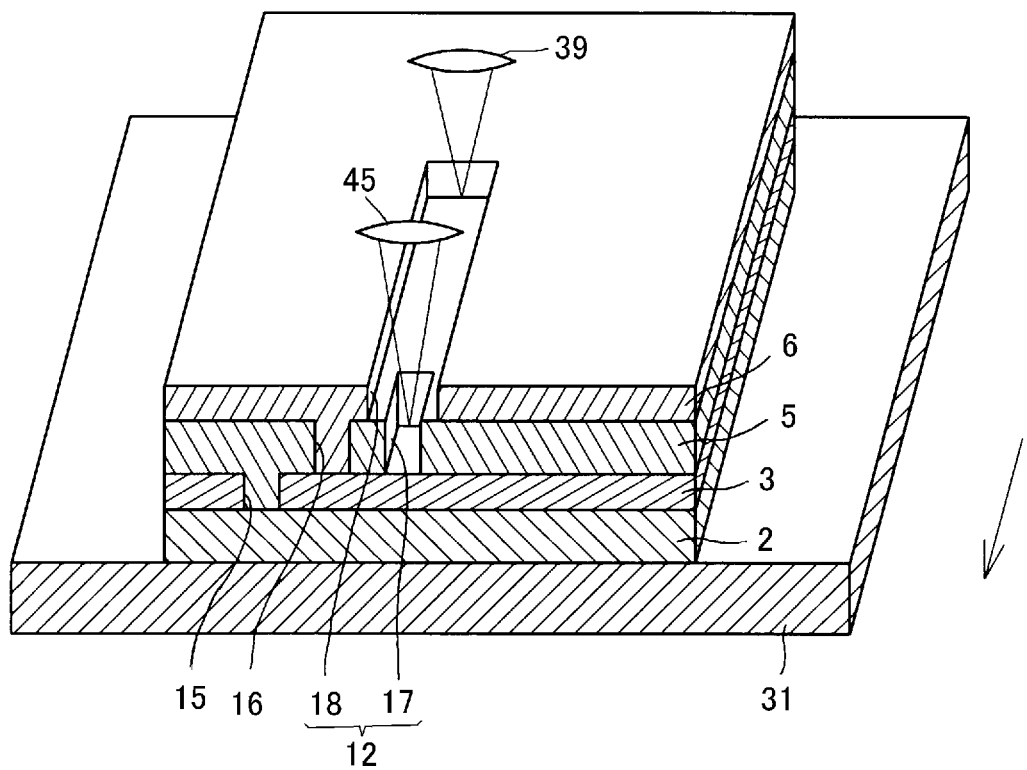
FIG. 6 is an explanatory view showing the flow of the laser beam of the laser scribing apparatus shown in FIG. 3.

On the other hand, as shown in FIG. 5, the substrate is irradiated with the second laser beam through the second optical path 46. Specifically, as shown in FIG. 5, the second laser beam has its direction changed by the beam splitter 35. Then the second laser beam is magnified by the concave lens 41, and enters the convex lens 43. At the convex lens 43, the second laser beam is converted into a collimated beam. Then, the second laser beam converted into the collimated beam is condensed by the convex lens (objective lens) 45, and the substrate, which is placed on the lower side in the top-bottom direction, is irradiated therewith from above in the top-bottom direction. Then, as the XY table 31 is shifted in the direction represented by the arrow in FIG. 6, the substrate is irradiated with the first laser beam and the second laser beam which are aligned in a row in the direction in which the grooves are to be formed.

As to the energy ratio at which the beam splitter 35 splits the laser beam into the first laser beam (transmitting light) and the second laser beam (reflected light), when the first laser beam (transmitting light) is 1, the second laser beam (reflected light) is preferably ½ to ¹⁄₁₀, more preferably ⅓ to ⅛, and particularly preferably ⅓ to ⅕. It is controlled such that the second laser beam is lower than the first laser beam in light quantity, and such that the first laser beam is greater than the second laser beam in power with which the substrate is radiated. It is preferable to control the power of the first laser beam to the extent with which only the second electrode layer 6 can be scribed.

Further, the laser beam is narrowed by the convex lens (objective lens). Here, the beam width of the first laser beam is controlled to become greater than that of the second laser beam. Note that it is also possible to control the beam width of the first laser beam to be greater than that of the second laser beam by means of a mask or the like.

By employing the laser scribing apparatus 30, the light emitting portion separating groove 17 and the second electrode layer separating groove 18 can be scribed substantially simultaneously in a series of operations.

Then, works such as molding of a not-shown power supply electrode, molding of a separating groove (not shown) on the outer side of the power supply electrode, removal of the second electrode layer 6 on the outer side of the separating groove, and sealing with a sealing material such as a silicon nitride film are performed, whereby the organic EL device 1 is completed.

Finally, a description will be given on the materials of the constituting members of the organic EL device 1.

The material of the substrate 2 (the base member) is not particularly limited, and a transparent substrate is employed. For example, the substrate 2 may be selected as appropriate from a flexible film substrate, a plastic substrate, and the like. A glass substrate or a film substrate is particularly preferable for its excellent transparency and workability.

The film substrate may be made of thermoplastic resin or thermosetting resin. The thermoplastic resin may include acrylic resin, polyester, polycarbonate resin, polyolefin, cyclo-olefin polymer, and the like. Further, the thermosetting resin may include polyurethane. In particular, a substrate with a main component being cyclo-olefin polymer (COP) which exhibits both an excellent optical isotropy and water vapor barrier property is preferable.

The COP may include norbornene polymer, a copolymer of norbornene and olefin, and a polymer of unsaturated alicyclic hydrocarbon such as cyclopentadiene. From the viewpoint of water vapor barrier property, it is preferable that a main chain and a side chain of a constituent element do not include a functional group that exhibits great polarity, i.e., a carbonyl group and a hydroxyl group.

The thickness of the film substrate is preferably about 0.03 mm to 3.0 mm. This range of thickness is preferable from the viewpoint of strength to bending or scratching of the substrate, in addition to handleability of the substrate and the viewpoint of weight during manufacture of the device. Further, from the viewpoint of excellent heat resistance, a material such as polyethylene naphthalate (PEN) and polyethersulfone (PES) can be used.

The material of the first electrode layer 3 is not particularly limited. For example, metal oxide such as indium tin oxide (ITO), indium zinc oxide (IZO), tin oxide ($SnO_2$), zinc oxide (ZnO) and the like and metal such as silver (Ag), chromium (Cr) and the like can be employed. ITO or IZO exhibiting high transparency can be particularly preferably used, considering its light extracting efficiency as to the light emitted from the light emitting layer in the function layer 5.

The first electrode layer 3 can be deposited by sputtering, CVD, vacuum deposition, and the like.

Figure 7:
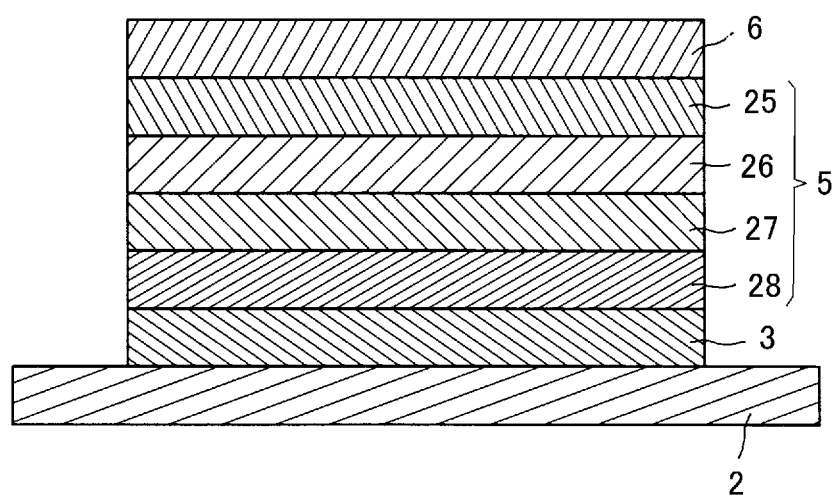
FIG. 7 is a cross-sectional view showing the layer structure of an organic EL element in the organic EL device shown in FIG. 1.

As shown in FIG. 7, the function layer 5 is structured such that the electron transportation layer 25, the light emitting layer 26, the hole transportation layer 27, and the hole injection layer 28 are stacked in this order from the second electrode layer 6 side.

The material of the electron transportation layer 25 may be any known substance. For example, 2-(4-biphenylyl)-5-(4-t-butylphenyl)-1,3,4-oxadiazole, 2,5-bis(1-naphthyl)-1,3,4-oxadiazole, oxadiazole derivatives, bis(10-hydroxybenzo[h] quinolinolate) beryllium complex, triazole compounds and the like can be used. However, the present invention is not limited thereto.

The material of the light emitting layer 26 may be any known substance. For example, 9,10-diarylanthracene derivatives, pyrene, coronene, perylene, rubrene, 1,1,4,4-tetraphenylbutadiene, tris(8-quinolinolate)aluminum complexes, tris(4-methyl-8-quinolinolate)aluminum complexes, bis(8-quinolinolate) zinc complexes, tris(4-methyl-5-trifluoromethyl-8-quinolinolate)aluminum complexes, tris(4-methyl-5-cyano-8-quinolino late)aluminum complexes, bis(2-methyl-5-trifluoromethyl-8-quinolinolate)[4-(4-cyanophenyl)phenolate]aluminum complexes, bis(2-methyl-5-cyano-8-quinolinolate) [4-(4-cyanophenyl)phenolate] aluminum complexes, tris(8-quinolinolate) scandium complexes, bis[8-(para-tosyl)aminoquinoline]zinc complexes and cadmium complexes, 1,2,3,4-tetraphenylcyclopentadiene, pentaphenylcyclopentadiene, poly-2,5-diheptyloxy-para-phenylenevinylene, coumarin phosphor, perylene phosphor, pyran phosphor, anthrone phosphor, porphyrin phosphor, quinacridone phosphor, N,N'-dialkyl substituted quinacridone phosphor, naphthalimide phosphor, N,N'-dialyl substituted pyrrolopyrrole phosphor and the like, a low-molecular luminescence material including a phosphorescent luminous body such as Ir complexes, a high-polymer material such as polyfluorene, polyparaphenylene vinylene, polythiophene, and polyspiro compounds, and a material in which a low-molecular material is dispersed in or copolymerized with any of the foregoing high-polymer materials can be used. However, the present invention is not limited thereto.

The material of the hole transportation layer 27 may be any known substance. For example, metal phthalocyanines such as copper phthalocyanine, tetra(t-butyl) copper phthalocyanine and the like, nonmetal phthalocyanines, quinacridone compound, aromatic amine low-molecular hole injection transportation materials such as 1,1-bis(4-di-p-tolylaminophenyl)cyclohexane, N,N'-diphenyl-N,N'-bis(3-methylphenyl)-1,1'-biphenyl-4,4'-diamine, N,N'-di(1-naphthyl)-N,N'-diphenyl-1,N'-diphenyl-1,1'-biphenyl-4,4'-diamine and the like, high-polymer hole transportation layer materials such as polyaniline, polythiophene, polyvinyl carbazole, and a mixture of poly(3,4-ethylenedioxythiophene) and polystyrene sulfonate, polythiophene oligomer material and the like can be used. However, the present invention is not limited thereto.

The material of the hole injection layer 28 may be any known substance. For example, 1,3,5-tricarbazolyl benzene, 4,4'-biscarbazolylbiphenyl, polyvinyl carbazole, m-biscarbazolylphenyl, 4,4'-biscarbazolyl-2,2'-dimethylbiphenyl, 4,4', 4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4, 4'-diamine (TPD), N,N'-di(naphtalene-1-yl)-N,N'-diphenyl benzidine (α-NPD), N,N'-diphenyl-N,N'-bis(1-naphthyl)-(1, 1'-biphenyl)-4,4'-diamine (NPB), poly(9,9-dioctylfluorene-co-N-(4-butylphenyl)diphenylamine) (TFB) or poly(9,9-dioctylfluorene-co-bis-N, N-phenyl-1,4-phenylenediamine) (PFB) can be used. However, the present invention is not limited thereto.

These constituting layers of the function layer 5 can be deposited by any known method as appropriate, such as vacuum deposition, sputtering, CVD, dipping, roll coating (printing), spin coating, bar coating, spraying, dye coating, flow coating and the like.

As to the second electrode layer 6, the material of the second electrode layer 6 may be any known substance. For example, the material may be silver, aluminum, and the like. Further, such materials are preferably deposited by sputtering or vacuum deposition.

In the embodiment described above, in the third scribing step, though the light emitting portion separating groove 17 and the second electrode layer separating groove 18 are scribed substantially simultaneously in a series of operations by one laser producing apparatus 32, the present invention is not limited thereto. The light emitting portion separating groove 17 and the second electrode layer separating groove 18 may be formed using a plurality of laser scribing apparatuses. Specifically, in the following, such a manner is described as a second embodiment. Note that identical reference signs are allotted to the elements similar to those of the first embodiment, and a description thereof will not be repeated.

Next, a description will be given on a manufacturing method for the organic EL device 1 according to the second embodiment. Note that since the method is identical to that according to the first embodiment other than the third scribing step, the description will be given solely on the third scribing step.

In the third laser scribing step of the present invention, the first laser irradiation step and the second laser irradiation step are performed independently of each other. In other words, the first laser irradiation step and the second laser irradiation step are separately performed as two steps.

The laser scribing apparatus according to the present embodiment used in the first laser irradiation step and the second laser irradiation step is any known laser scribing apparatus, and has an XY table, a laser producing apparatus, and an optical member.

The first laser irradiation step is performed as follows. A substrate on which an organic EL element is stacked is placed on the XY table. The substrate is linearly shifted in a longitudinal direction at a constant speed while being irradiated with a laser beam. Then, the XY table is shifted in a lateral direction to displace the irradiation position of the laser beam. The substrate is again linearly shifted in the longitudinal direction while being irradiated with a laser beam.

Further, though the light source of the first laser beam in forming the second electrode layer separating groove 18 can be arbitrarily selected, YAG, $YVO_4$, YLF, or a fiber laser can be employed.

Still further, a laser beam with a wavelength of 200 to 1100 nm can be employed. Specifically, a laser beam with a wavelength of 200 to 380 nm is preferable. A laser beam with a wavelength of 355 nm is particularly preferable. Further, in the present embodiment, from the viewpoint of unlikeliness of occurrence of a large burr, the top-hat shape laser beam having a beam shape of uniform energy distribution is used.

For example, with the YAG laser of great versatility, an nth harmonic laser beam (n=2 to 3) can be used. The laser scribing apparatus used in the third laser scribing step employs pulse oscillation and irradiates the laser beam using constant pulse signals by shifting a relative position between the laser beam irradiation position and the substrate by means of the XY table, as described above, and thus is capable of forming the second electrode layer separating groove 18 in the form of pits each having a substantially identical shape aligned at a constant pitch.

Further, the average output of the first laser beam is set to the extent that only the second electrode layer 6 can be sublimated. Specifically, 0.8 W to 2.0 W is preferable. 1.0 W to 1.8 W is more preferable, and 1.2 W to 1.6 W is particularly preferable.

Further, the laser scribing apparatus used in the first laser irradiation step uses pulsed oscillation, and generates the first laser beam according to pulse signals of a prescribed frequency.

Specifically, the pulse width of the pulse signal is preferably 200 fsec to 100 nsec. A pulse width of 10 psec to 10 nsec is more preferable. A pulse width of 2 nsec to 6 nsec is particularly preferable.

The second laser irradiation step is performed with a laser scribing apparatus being similar to that used in the first laser irradiation step. Further, the second laser beam follows the track of the first laser beam, and the inside of the second electrode layer separating groove 18 formed by the first laser beam is irradiated therewith.

Further, though the light source of the second laser beam in forming the light emitting portion separating groove 17 can be arbitrarily selected, YAG, YVO$_4$, YLF, or a fiber laser can be employed.

Further, the beam diameter of the second laser beam is smaller than that of the first laser beam. As used herein, the "beam diameter" adheres to ISO standard 11146. Further, by means of a not-shown lens or the like, it is controlled such that the beam width of the first laser beam becomes greater than that of the second laser beam.

Further, the wavelength of the second laser beam is greater than that of the first laser beam. Specifically, a laser beam with a wavelength of 200 to 1100 nm can be employed. A laser beam with a wavelength of 500 to 600 nm is preferable. A laser beam with a wavelength of 532 nm is particularly preferable. Further, in the present embodiment, from the viewpoint of low energy load, the top-hat shape laser beam having a beam shape in which energy distribution is uniform is used.

The laser scribing apparatus used in the second laser irradiation step employs pulse oscillation and irradiates the laser beam using constant pulse signals by shifting a relative position between the laser beam irradiation position and the substrate by means of the XY table, as described above, and thus is capable of forming the light emitting portion separating groove 17 in the form of pits each having a substantially identical shape aligned at a constant pitch.

Further, the average output of the second laser beam is smaller than the average output of the first laser beam. The average output is preferably 0.1 W to 1.0 W. An average output of 0.2 W to 0.8 W is more preferable, and 0.3 W to 0.5 W is particularly preferable.

Further, the laser scribing apparatus used in the second laser irradiation step uses pulsed oscillation, and generates the second laser beam according to pulse signals of a prescribed frequency, and the pulse width of the second laser beam is shorter than the pulse width of the first laser beam.

Specifically, the pulse width of the pulse signal is preferably 200 fsec to 100 nsec. A pulse width of 1 psec to 10 nsec is more preferable. A pulse width of 10 psec to 50 psec is particularly preferable. Since the pulse width of the second laser beam is extremely small, the energy load put on the substrate during laser beam irradiation is small. That is, the light emitting portion separating groove 17 can be formed while allowing little heat generation at the second electrode layer 6.

According to the present invention, since the light emitting portion separating groove 17 can be formed while allowing little heat generation at the second electrode layer 6, impairment of the function layer 5 by heat can be prevented.

Figure 8:
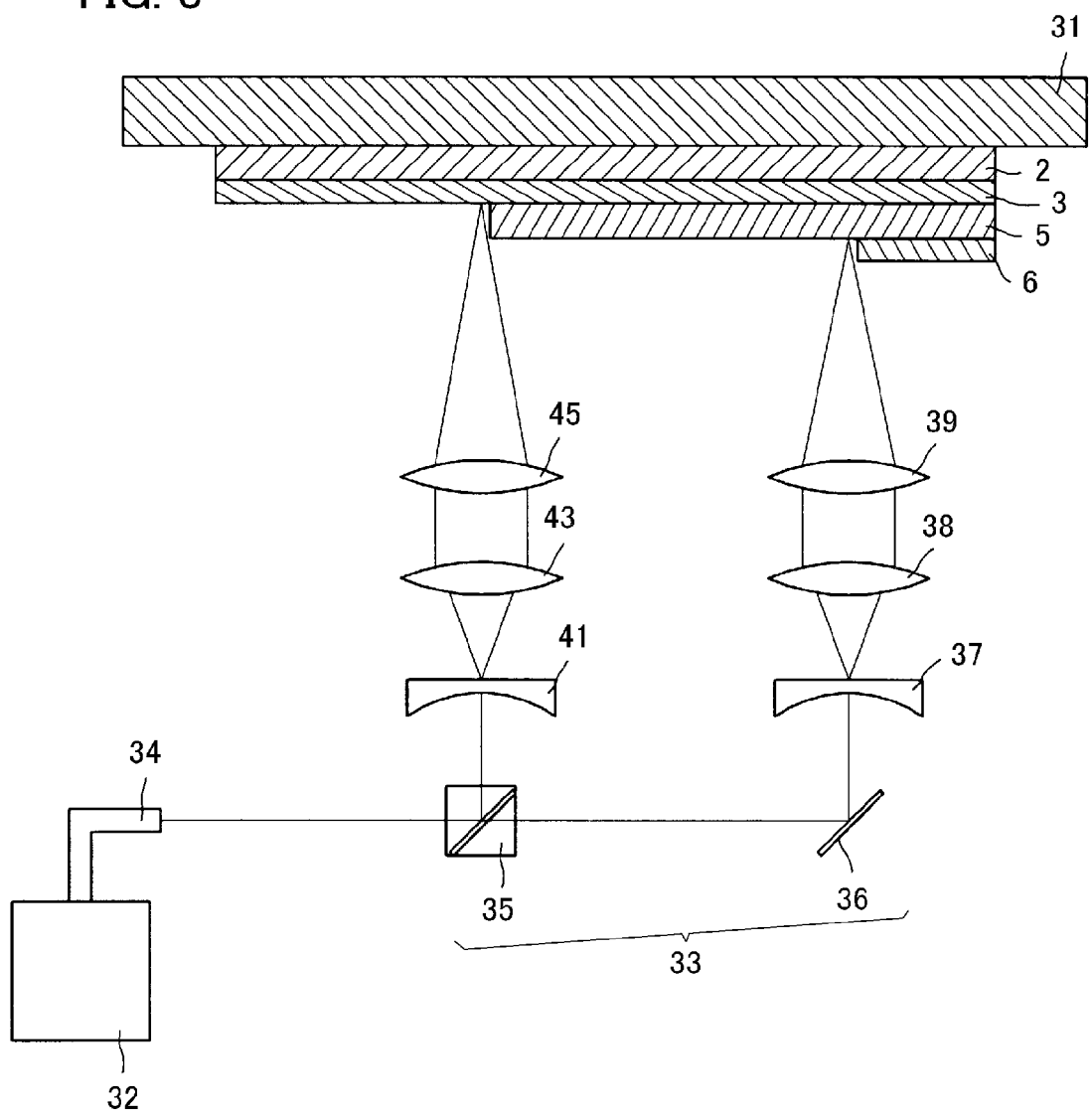
FIG. 8 is a schematic view of a laser scribing apparatus according to another embodiment of the present invention.

In the embodiments described above, in the third scribing step, the XY table 31 is placed on the lower side in the top-bottom direction, and the substrate placed on the XY table 31 is irradiated with the laser beam from above in the top-bottom direction. However, the present invention is not limited thereto. As shown in FIG. 8, the XY table 31 may be placed on the upper side in the top-bottom direction, and the substrate fixed to the bottom surface of the XY table 31 may be irradiated with a laser beam from below in the top-bottom direction. In this case, since impurities such as dust and shavings (the function layer 5, the second electrode layer 6, and the like) that are generated in forming the light emitting portion separating groove 17 and the second electrode layer separating groove 18 fall from the substrate by gravitation, the impurities do not easily remain on the substrate. That is, unevenness does not easily appear on the substrate, making it difficult for the leakage current to flow.

In the embodiments described above, in the first laser scribing step, though laser scribing processing is performed as the patterning scheme, the present invention is not limited thereto, and patterning may be performed according to other scheme. For example, patterning can be performed by lift-off, reactive ion etching (RIE), photolithography, a water jet, and the like.

Further, in the embodiments described above, the function layer separating groove 16 is formed on the function layer 5 in the second laser scribing step. However, the function layer 5 is not necessarily provided with a "groove". That is, in the embodiment described above, the laser beam is caused to radiate using constant pulse signals, and the circular dots created by the pulses are connected to one another to form the function layer separating groove 16. Here, the function of the function layer separating groove 16 is to penetrate through the function layer 5 to allow a portion of the second electrode layer 6 to enter therein, to thereby structure the connection portion 51, where a portion of the second electrode layer 6 is brought into contact with the first electrode layer 3. Accordingly, the circular dots by the pulses are not necessarily connected, and the function layer 5 may be independent holes being aligned with one another.

Figure 10:
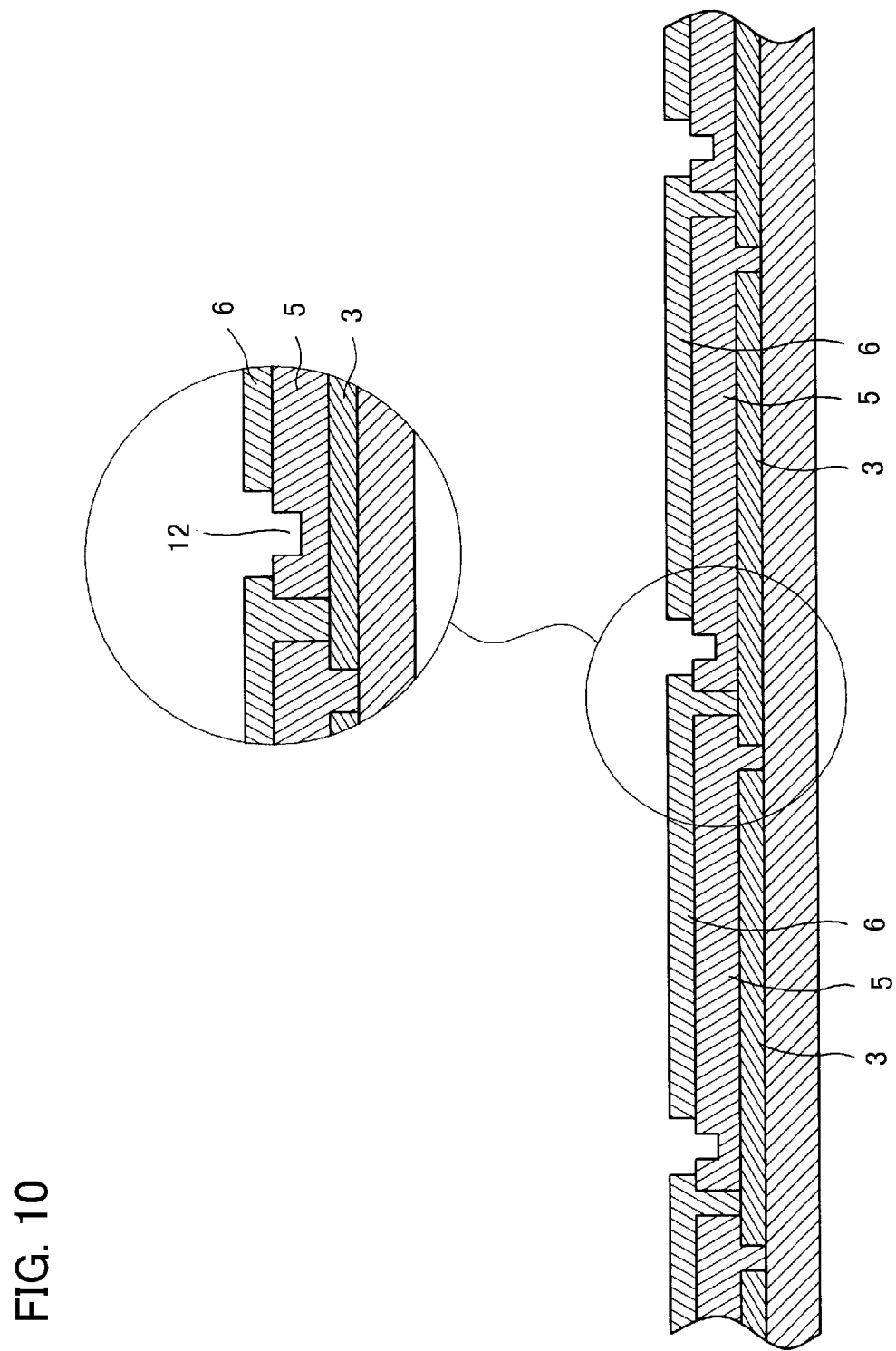
FIG. 10 is a cross-sectional view of an organic EL device according to another embodiment of the present invention with its back side up.
Figure 11:
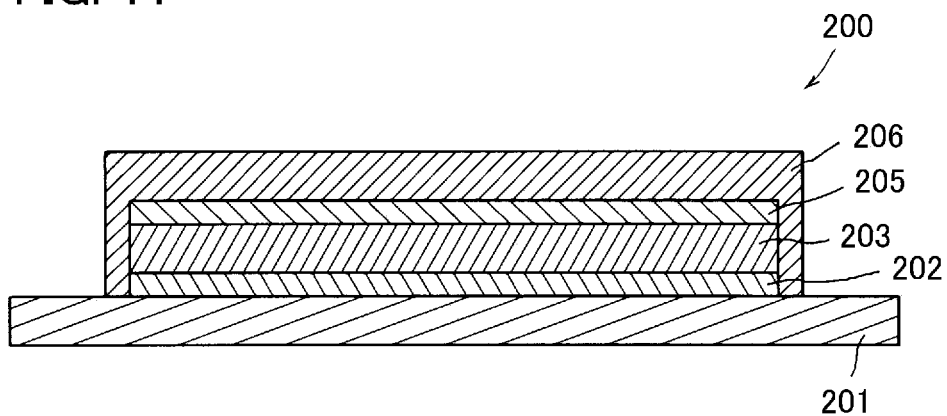
FIG. 11 is a cross-sectional view showing a conventional organic EL device.
Figure 12:
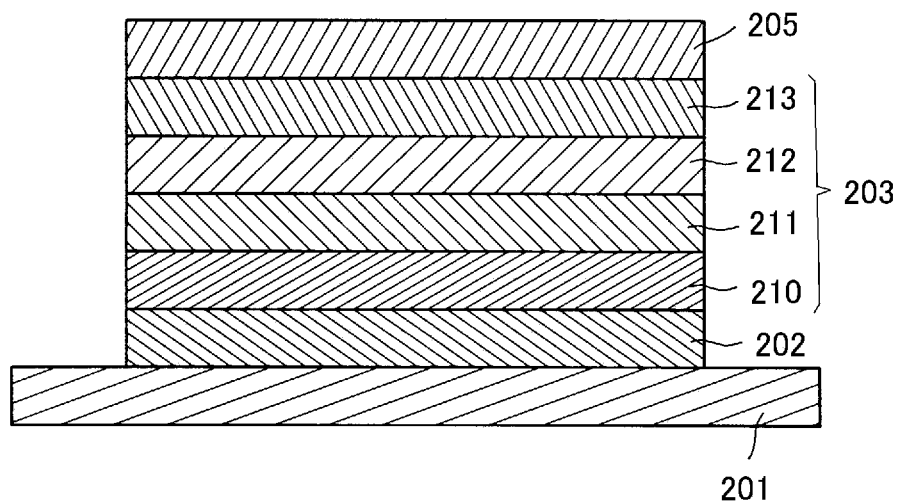
FIG. 12 is a cross-sectional view showing the layer structure of an organic EL element in the conventional organic EL device.
Figure 13:
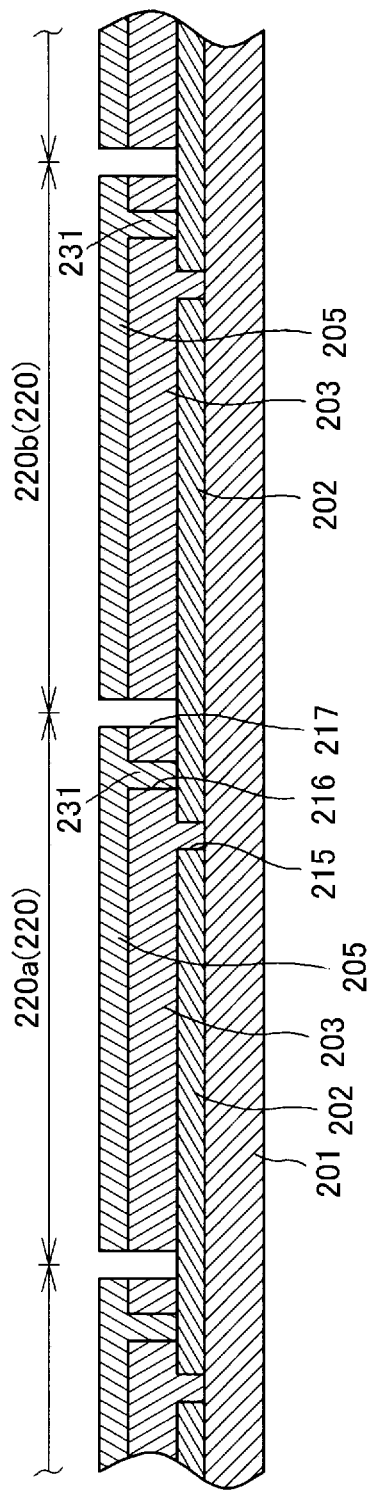
FIG. 13 is a cross-sectional view showing the conventional organic EL device with its back side up.
Figure 14A:
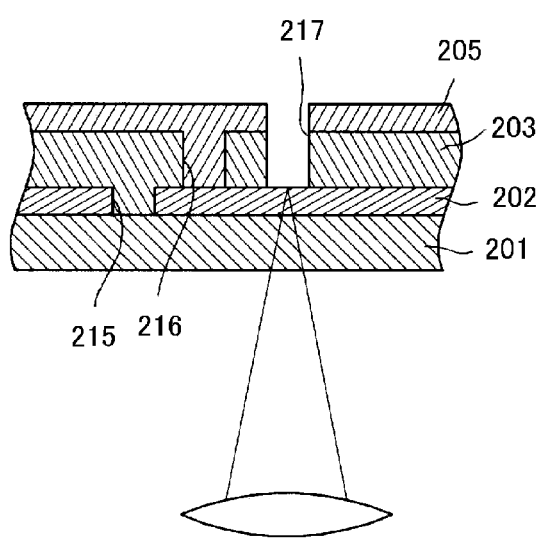
Figure 14B:
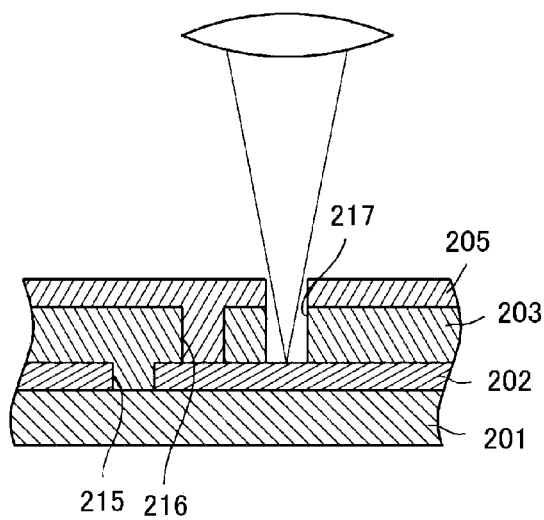
Figure 15:
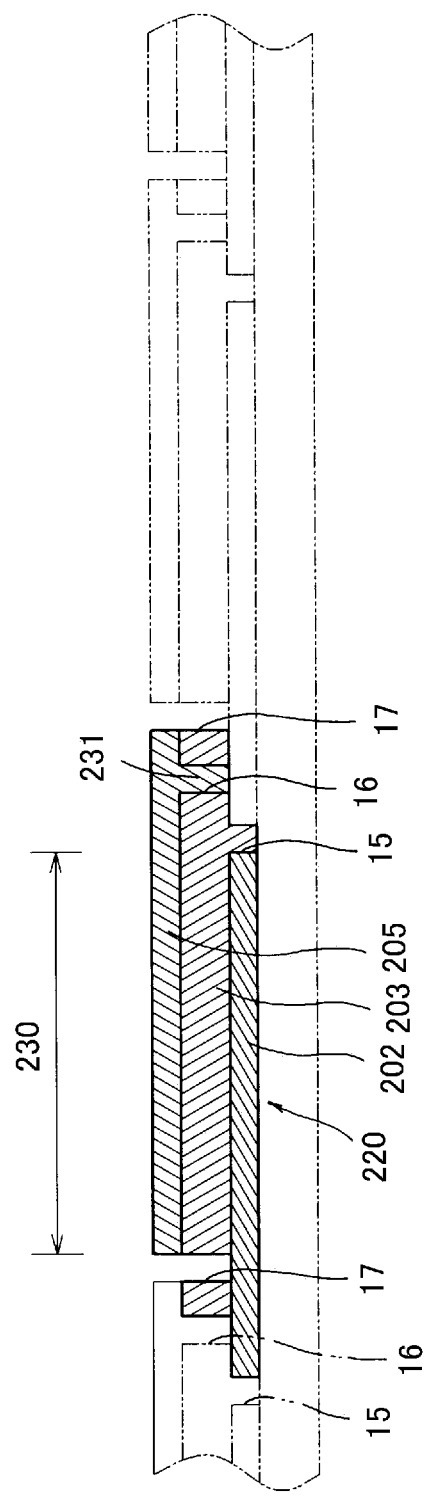
FIG. 15 is a cross-sectional view of one unit EL element which is represented by solid lines in the conventional organic EL device.

Further, in the embodiments described above, in the disclosed structure of the unit light emitting element separating groove 12, not only the second electrode layer 6 but also the function layer 5 is completely removed. That is, the unit light emitting element separating groove 12 described in the foregoing is illustrated as follows: the function layer 5 is completely peeled off and the first electrode layer 3 is exposed. However, the depth of the unit light emitting element separating groove 12 will suffice so long as the unit light emitting element separating groove 12 extends from the second electrode layer 6 side to reach the function layer 5. The unit light emitting element separating groove 12 does not necessarily reach the first electrode layer 3. That is, the depth of the unit light emitting element separating groove 12 will suffice so long as the unit light emitting element separating groove 12 trenches the function layer 5 from the second electrode layer 6. As shown in FIG. 10, a portion of the function layer 5 may remain at the bottom.

In the following, the present invention will be more specifically described by showing examples. However, the present invention is not limited to those examples.

Note that in the following description, for the sake of convenience, the following is determined: in the case where the substrate is placed on the lower side in the top-bottom direction relative to the light source and a laser beam is radiated toward the lower side in the top-bottom direction, such a state is referred to as scribe down; and in the case where the substrate is placed on the upper side in the top-bottom direction relative to the light source and a laser beam is radiated toward the upper side in the top-bottom direction, such a state is referred to as scribe up.

EXAMPLE

A description will be given on fabrication procedures of the organic EL devices according to specific examples of the present invention and according to a comparative example, and the evaluation results thereof.

Example 1

As a substrate for forming an organic EL device, an alkali-free glass (thickness: 0.7 mm) having an ITO layer (indium tin oxide, thickness: 150 nm) stacked on one of its surface as the first electrode layer was used. On this substrate, using a laser scribing apparatus, a pattern was formed at 6 mm intervals such that each groove is formed to have a width of 50 nm. Thus, the first electrode layer separating groove 15 was formed.

This substrate was cleaned with a surfactant by using a brush, and subjected to ultrasonic cleaning with pure water. Thereafter, the substrate was dried in an oven. This substrate was moved to a vacuum deposition apparatus, and materials were deposited in a vacuum as follows.

On the first electrode layer, as the hole injection layer, a mixture layer of 4,4'-bis[N-(2-naphthyl)-N-phenyl-amino] biphenyl (hereinafter abbreviated as NPB) and molybdenum trioxide was deposited at a thickness of 10 nm by vacuum deposition. The deposition of the hole injection layer was carried out by co-deposition such that a thickness ratio of 9:1 is achieved between NPB and molybdenum trioxide.

Subsequently, as the hole transportation layer, NPB was deposited at a thickness of 50 nm (deposition speed: 0.08 nm/sec to 0.12 nm/sec) by vacuum deposition.

Subsequently, as the light emitting layer and the electron transportation layer, tris(8-quinolinolate)aluminum (hereinafter abbreviated as Alq3) was deposited at a thickness of 70 nm (deposition speed: 0.24 nm/sec to 0.28 nm/sec) by vacuum deposition.

Subsequently, as the electron injection layer, LiF was deposited at a thickness of 1 nm (deposition speed: 0.03 nm/sec to 0.05 nm/sec) by vacuum deposition.

Al was deposited at a thickness of 300 nm (deposition speed: 0.3 nm/sec to 0.5 nm/sec) by vacuum deposition. At this substrate, the function layer separating groove 16 was formed using a laser scribing apparatus.

Subsequently, as the second electrode layer, Al was deposited at a thickness of 150 nm (deposition speed: 0.3 nm/sec to 0.5 nm/sec) using vacuum deposition.

This substrate was irradiated with a laser from the second electrode layer side using a laser scribing apparatus, whereby the second electrode layer separating groove was formed (the first laser irradiation step). The condition for this laser scribing apparatus was as follows: a wavelength of 355 nm, an average output of 1.5 W, a beam diameter of 50 µm, and a pulse width of 2 nsec. Thereafter, the substrate was again irradiated with the laser from the second electrode layer side using the laser scribing apparatus, whereby the light emitting portion separating groove was formed (the second laser irradiation step). The condition for this laser scribing apparatus was as follows: a wavelength of 532 nm, an average output of 0.5 W, a beam diameter of 30 µm, and a pulse width of 2 nsec. In this manner, an organic EL element in which unit EL elements having unit dimension of 30 mm×30 mm and 6 mm×18 mm are aligned by three stages in series was fabricated.

Note that in the third laser scribing step (the first laser irradiation step and the second laser irradiation step), the substrate was placed on the lower side in the top-bottom direction relative to the light source of the laser beam inside the laser scribing apparatus (scribe down), and the second electrode layer side of the substrate was irradiated with a laser beam from above in the top-bottom direction.

Thereafter, this organic EL element was moved from the vacuum atmosphere to a glove box of a nitrogen atmosphere. The organic EL element was moved to a plasma CVD apparatus, and a silicon nitride film was formed at 2 µm and sealed. The organic EL device formed in this manner was designated as Example 1.

Example 2

In the procedure of Example 1, in the third laser scribing step, one laser beam was split into two beams, and the first laser irradiation step and the second laser irradiation step were carried out simultaneously. Specifically, the substrate was placed on the lower side in the top-bottom direction relative to the light source of the laser beams inside the laser scribing apparatus (scribe down), and the second electrode layer side of the substrate was irradiated with the split laser beams from above in the top-bottom direction. The condition of the laser scribing apparatus at this time was as follows: a wavelength of 355 nm, an average output of 2.0 W, and a pulse width of 2 nsec. Further, the energy ratio between the first laser beam and the second laser beam was set to 3:1. Further, the beam diameter of the first laser beam was 50 µm, and the beam diameter of the second laser beam was 30 µm.

Example 3

In the third laser scribing step (the first laser irradiation step and the second laser irradiation step) of the fabrication procedure of Example 1, the substrate was placed on the upper side in the top-bottom direction relative to the light source of the laser beam inside the laser scribing apparatus (scribe up), and the second electrode layer side was irradiated with the laser beam from below in the top-bottom direction.

Comparative Example 1

In the fabrication procedure of Example 1, in the third laser scribing step, the substrate was irradiated with one laser beam from the substrate side. Then, the function layer and the second electrode layer were simultaneously removed, whereby the unit light emitting element separating groove that linearly communicates between the function layer and the second electrode layer was formed. Specifically, the substrate was placed on the lower side in the top-bottom direction relative to the light source of the laser beam inside the laser scribing apparatus (scribe down), and the substrate was irradiated with a laser beam from above in the top-bottom direction.

The condition of the laser scribing apparatus at this time was as follows: a wavelength of 355 nm, an average output of 20 W, and a pulse width of 2 nsec.

[Light Emission Defect Measurement]

A high temperature/humidity light emission test was carried out as to the organic EL device of each of Examples 1 to 3 and Comparative Example 1, and the light emission defect was evaluated. The test condition was as follows: an atmosphere of 60° C./85% RH relative humidity), and an applied voltage of 5V. Observation was made at room temperature with a stereoscopic microscope with about 10× magnification. Then, the number of light emission defects one hour after the test and 1000 hours after the test were evaluated. The result is shown in Table 1.

TABLE 1

Evaluation of the Number of Light Emission Defects in High Temperature/Humidity Light Emission Test

| | The Number of Emission Defects (in number) | | | |
|---|---|---|---|---|
| | Example 1 | Example 2 | Example 3 | Comparative Example 1 |
| One Hour Later | 3 | 5 | 1 | 25 |
| 1000 Hours Later | 6 | 10 | 3 | 41 |
| Increase Amount | 3 | 5 | 2 | 16 |

As shown in Table 1, the result of one hour after the test and that of 1000 hours after the test are compared against each other. The number of light emission defects of Example 1 increases from three to six, showing an increase in light emission defects by three in number. The number of light emission defects of Example 2 increases from five to ten, showing an increase in light emission defects by five in number. The number of light emission defects of Example 3 increases from one to three, showing an increase in light emission defects by two in number. On the other hand, with Comparative Example 1, the number of light emission defects increases from 25 to 41, showing an increase in light emission defects by 16 in number.

The number of light emission defects one hour after the test of the organic EL devices of Examples 1 to 3 is ⅕ times as great as that of the organic EL device of Comparative Example 1 or smaller than that. That is, with the manufacturing methods of Examples 1 to 3 of the present invention, the organic EL devices of high light emission quality with the smaller number of light emission defects were manufactured.

Further, as to 1000 hours after the test also, the number of light emission defects of the organic EL devices of Examples 1 to 3 of the present invention is suppressed to be ¼ times as great as the number of light emission defects of the organic EL device of Comparative Example 1 or smaller than that. That is, with the manufacturing methods of Examples 1 to 3 of the present invention, the organic EL devices of high durability were manufactured.

DESCRIPTION OF NUMERALS

1 organic EL device
2 substrate (base member)
3 first electrode layer
5 function layer (organic light emitting layer)
6 second electrode layer
10 organic EL element (stack)
12 unit light emitting element separating groove
15 first electrode layer separating groove
16 function layer separating groove (light emission separating groove)
17 light emitting portion separating groove (organic light emitting layer portion)
18 second electrode layer separating groove (second electrode layer portion)
20 unit organic EL element

The invention claimed is:

1. A manufacturing method of an organic EL device, comprising:
   forming a substrate, at least a first electrode layer, an organic light emitting layer, and a second electrode layer being stacked on the substrate;
   forming a first electrode layer separating groove that separates the first electrode layer into a plurality of small pieces;
   forming a light emission separating groove that separates the organic light emitting layer into a plurality of small light emitting regions;
   forming a unit light emitting element separating groove that has a depth extending from the second electrode layer to trench the organic light emitting layer, the unit light emitting element separating groove separating the second electrode layer into a plurality of small pieces; and
   forming a connection portion that penetrates through the organic light emitting layer to connect between the second electrode layer and the first electrode layer, one of the small pieces of the first electrode layer, one of the small pieces of the second electrode layer, and a portion of the organic light emitting layer therebetween structuring a unit light emitting portion, the unit light emitting portion being electrically connected in series via the connection portion,
   wherein a portion of the second electrode layer enters inside the light emission separating groove, whereby the connection portion is structured, the unit light emitting element separating groove being formed by a second electrode layer separating groove and a light emitting portion separating groove, the second electrode layer separating groove and the light emitting portion separating groove being each a laser groove, an average groove width of the second electrode layer separating groove being greater than an average groove width of the light emitting portion separating groove,
   wherein a boundary between the second electrode layer separating groove and the light emitting portion separating groove is stepwise,
   wherein a part of the second electrode layer extends to a unit light emitting element separating groove side and beyond the light emission separating groove, and
   wherein forming the unit light emitting element separating groove is accomplished by performing radiation of a laser beam from a second electrode layer side at least twice.

2. A manufacturing method of an organic EL device, comprising:
   forming a substrate, at least a first electrode layer, an organic light emitting layer, and a second electrode layer being stacked on the substrate;
   forming a first electrode layer separating groove that separates the first electrode layer into a plurality of small pieces;
   forming a unit light emitting element separating groove that has a depth extending from the second electrode layer to trench the organic light emitting layer, the unit light emitting element separating groove separating the second electrode layer into a plurality of small pieces; and forming a connection portion that penetrates through the organic light emitting layer to connect between the second electrode layer and the first electrode layer, one of the small pieces of the first electrode layer, one of the small pieces of the second electrode layer, and a portion of the organic light emitting layer therebetween structuring a unit light emitting portion, the unit light emitting portion being electrically connected in series via the connection portion, wherein the unit light emitting element separating groove is formed by performing radiation of a laser beam from a second electrode layer side at least twice, including a first laser irradiation step of forming a groove at least on the second electrode layer and a second laser irradiation step of irradiating an inside of the groove formed by the first laser irradiation step with a laser beam, and wherein the laser beam used in the first laser irradiation step and the laser beam used in the second laser irradiation step are different in a radiation area.

3. The manufacturing method of the organic EL device according to claim 2, wherein the laser beam used in the first laser irradiation step and the laser beam used in the second laser irradiation step are different in at least one of a wavelength, power, and a pulse radiation time.

4. The manufacturing method of the organic EL device according to claim 2, wherein power of the laser beam used in the first laser irradiation step is greater than power of the laser beam used in the second laser irradiation step.

5. The manufacturing method of the organic EL device according to claim 2, wherein a beam width of the laser beam used in the first laser irradiation step is greater than a beam width of the laser beam used in the second laser irradiation step.

6. The manufacturing method of the organic EL device according to claim 2, wherein the unit light emitting element separating groove is formed by performing radiation of the laser beam from the second electrode layer side and shifting an irradiation position of the laser beam, the laser beam being split into at least two beams from a common laser beam source, wherein irradiation positions of the laser beams split into at least two are shifted to and fro in a moving direction of the irradiation positions of the laser beams, and wherein the first laser irradiation step is performed by one of the laser beams that is firstly caused to radiate, and the second laser irradiation step is performed by other one of the laser beams that is subsequently caused to radiate.

7. The manufacturing method of the organic EL device according to claim 2, wherein a wavelength of the laser beam used in the first laser irradiation step is shorter than a wavelength of the laser beam used in the second laser irradiation step.

8. The manufacturing method of the organic EL device according to claim 7, wherein the wavelength of the laser beam used in the first laser irradiation step is 355 nm, and the wavelength of the laser beam used in the second laser irradiation step is 532 nm.

9. The manufacturing method of the organic EL device according to claim 2, wherein the laser beam used in the first laser irradiation step and the laser beam used in the second laser irradiation step are radiated upward in a top-bottom direction.

10. The manufacturing method of the organic EL device according to claim 2, wherein a wavelength of the laser beam used in the first laser irradiation step is outside a visible region.

11. A manufacturing method of an organic EL device, comprising:

forming a substrate, at least a first electrode layer, an organic light emitting layer, and a second electrode layer being stacked on the substrate;

forming a first electrode layer separating groove that separates the first electrode layer into a plurality of small pieces;

forming a light emission separating groove that separates the organic light emitting layer into a plurality of small light emitting regions; and forming a unit light emitting element separating groove that has a depth extending from the second electrode layer to reach the organic light emitting layer, the unit light emitting element separating groove separating the second electrode layer into a plurality of small pieces, one of the small pieces of the first electrode layer, one of the small light emitting regions and one of the small pieces of the second electrode layer structuring a unit EL element, the unit EL element being electrically connected in series, wherein the unit light emitting element separating groove is formed by performing radiation of a laser beam from a second electrode layer side at least twice, including a first laser irradiation step of forming a groove at least on the second electrode layer and a second laser irradiation step of irradiating an inside of the groove formed by the first laser irradiation step with a laser beam, and wherein the laser beam used in the first laser irradiation step and the laser beam used in the second laser irradiation step are different in a radiation area.

* * * * *